United States Patent
Chen et al.

(10) Patent No.: US 11,489,111 B2
(45) Date of Patent: Nov. 1, 2022

(54) REVERSIBLE RESISTIVE MEMORY LOGIC GATE DEVICE

(71) Applicant: International Business Machines Corporation, Armonk, NY (US)

(72) Inventors: Hsueh-Chung Chen, Cohoes, NY (US); Junli Wang, Slingerlands, NY (US); Su Chen Fan, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/216,622

(22) Filed: Mar. 29, 2021

(65) Prior Publication Data

US 2022/0310908 A1   Sep. 29, 2022

(51) Int. Cl.
| | | |
|---|---|---|
| *H01L 45/00* | (2006.01) | |
| *G11C 13/00* | (2006.01) | |
| *H03K 19/20* | (2006.01) | |

(52) U.S. Cl.
CPC .......... *H01L 45/06* (2013.01); *G11C 13/0004* (2013.01); *G11C 13/004* (2013.01); *G11C 13/0069* (2013.01); *H01L 45/128* (2013.01); *H01L 45/1233* (2013.01); *H01L 45/144* (2013.01); *H03K 19/20* (2013.01); *G11C 2013/0045* (2013.01); *G11C 2013/0078* (2013.01)

(58) Field of Classification Search
None
See application file for complete search history.

(56) References Cited

U.S. PATENT DOCUMENTS

| | | | |
|---|---|---|---|
| 7,005,665 B2 | 2/2006 | Furkay | |
| 7,989,789 B2 | 8/2011 | Toda | |
| 8,854,859 B2 | 10/2014 | Chung | |
| 9,369,130 B2 | 6/2016 | Miao | |
| 2010/0265749 A1* | 10/2010 | Wang | H01L 45/14 257/421 |
| 2012/0211715 A1* | 8/2012 | Asano | H01L 45/144 257/1 |
| 2020/0075852 A1* | 3/2020 | Seong | H01L 45/12 |
| 2021/0027829 A1* | 1/2021 | Kim | G11C 11/4085 |
| 2021/0305508 A1* | 9/2021 | Lee | H01L 27/2427 |

OTHER PUBLICATIONS

Gaillardon et al., "Phase-Change-Memory-Based Storage Elements for Configurable Logic," 2010 International Conference on Field-Programmable Technology, Dec. 8-10, 2010, pp. 17-20.
Li et al., "Nonvolatile "And," "Or," and "NOT" Boolean logic gates based on phase-change memory," Journal of Applied Physics 114(23):234503, Dec. 2013, 4 pages.
Wei et al., "A Scalable and High-Density FPGA Architecture with Multi-Level Phase Change Memory," 2015 Design, Automation & Test in Europe Conference & Exhibition (DATE), Mar. 9-13, 2015, pp. 1365-1370.

* cited by examiner

*Primary Examiner* — Tan T. Nguyen
(74) *Attorney, Agent, or Firm* — Grant M. McNeilly

(57) ABSTRACT

A memory device includes two phase change memory (PCM) cells and a bridge. The first PCM cell includes an electrical input and a phase change material. The second PCM cell includes an electrical input that is independent from the electrical input of the first PCM cell and another phase change material. The bridge is electrically connected to the two PCM cells.

20 Claims, 22 Drawing Sheets

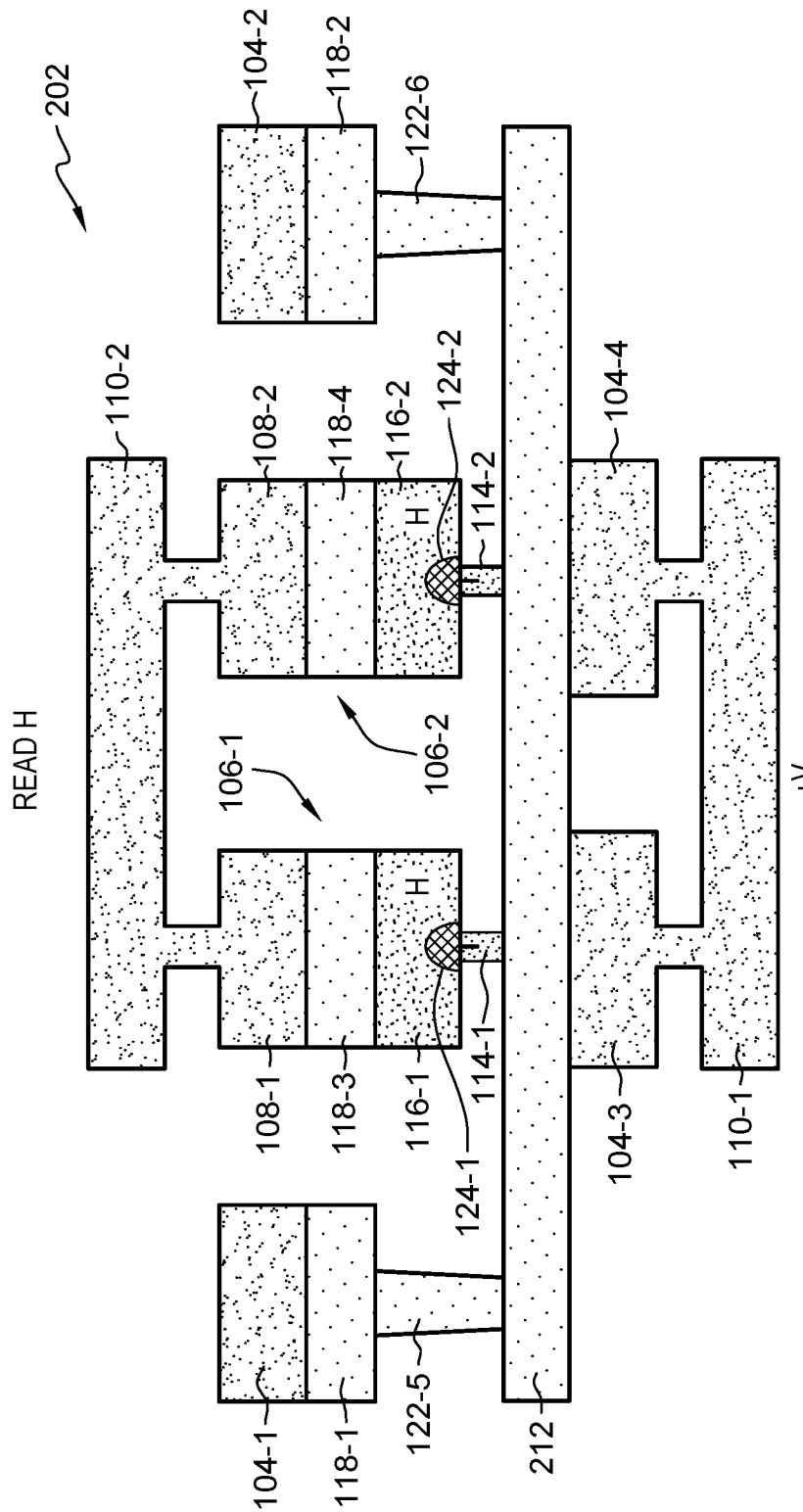

REVERSIBLE RESISTIVE MEMORY LOGIC GATE DEVICE

BACKGROUND

The present invention relates to integrated circuits, and more specifically, to logic gate memory for computing.

Traditional complementary metal-oxide-semiconductors (CMOSs) have been scaled down in size, which allows for the production of hand-held devices that include enormous computing power. However, CMOSs can consume a significant amount of electrical power, for example, to enable a silicon logic gate to maintain its value in order to store data in a computer memory. Unfortunately, such power consumption can limit battery life, which can decrease the flexibility and utility of the device.

SUMMARY

According to an embodiment of the present disclosure, a memory device includes two phase change memory (PCM) cells and a bridge. The first PCM cell includes an electrical input and a phase change material. The second PCM cell includes an electrical input that is independent from the electrical input of the first PCM cell and another phase change material. The bridge is electrically connected to the two PCM cells.

According to an embodiment of the present disclosure, a memory device for an integrated circuit is disclosed. The logic gate memory device includes a first phase change memory (PCM) cell that includes a first electrical output, and a second PCM cell that includes a second electrical output. The memory device also includes a first electrical input that is electrically connected to the first PCM cell, a second electrical input that is electrically connected to the second PCM cell, wherein the second electrical input is independent from the first electrical input. The memory device also includes a bridge that is electrically connected to the first electrical output and the second electrical output.

According to an embodiment of the present disclosure, a method of using a memory device that includes a first phase change memory (PCM) cell with a first input and a first PCM material, a second PCM cell with a second input that is independent from the first input and a second PCM material, and a bridge electrically connecting a first output of the first PCM cell and a second output of the second PCM cell is disclosed. The method includes passing a first electrical current pulse from the first input into the first PCM material to create a first amorphous zone in the first PCM cell, measuring a voltage drop across the first PCM cell and the second PCM cell using a third input electrically connected to the first PCM cell and a second input electrically connected to the second PCM cell, and determining whether the memory device is storing a true or false result based on the voltage drop.

BRIEF DESCRIPTION OF THE DRAWINGS

FIGS. 4A-4H are a series of cross-section views of the NOR LGMD in different states, in accordance with an embodiment of the present disclosure.

DETAILED DESCRIPTION

Figure 1:
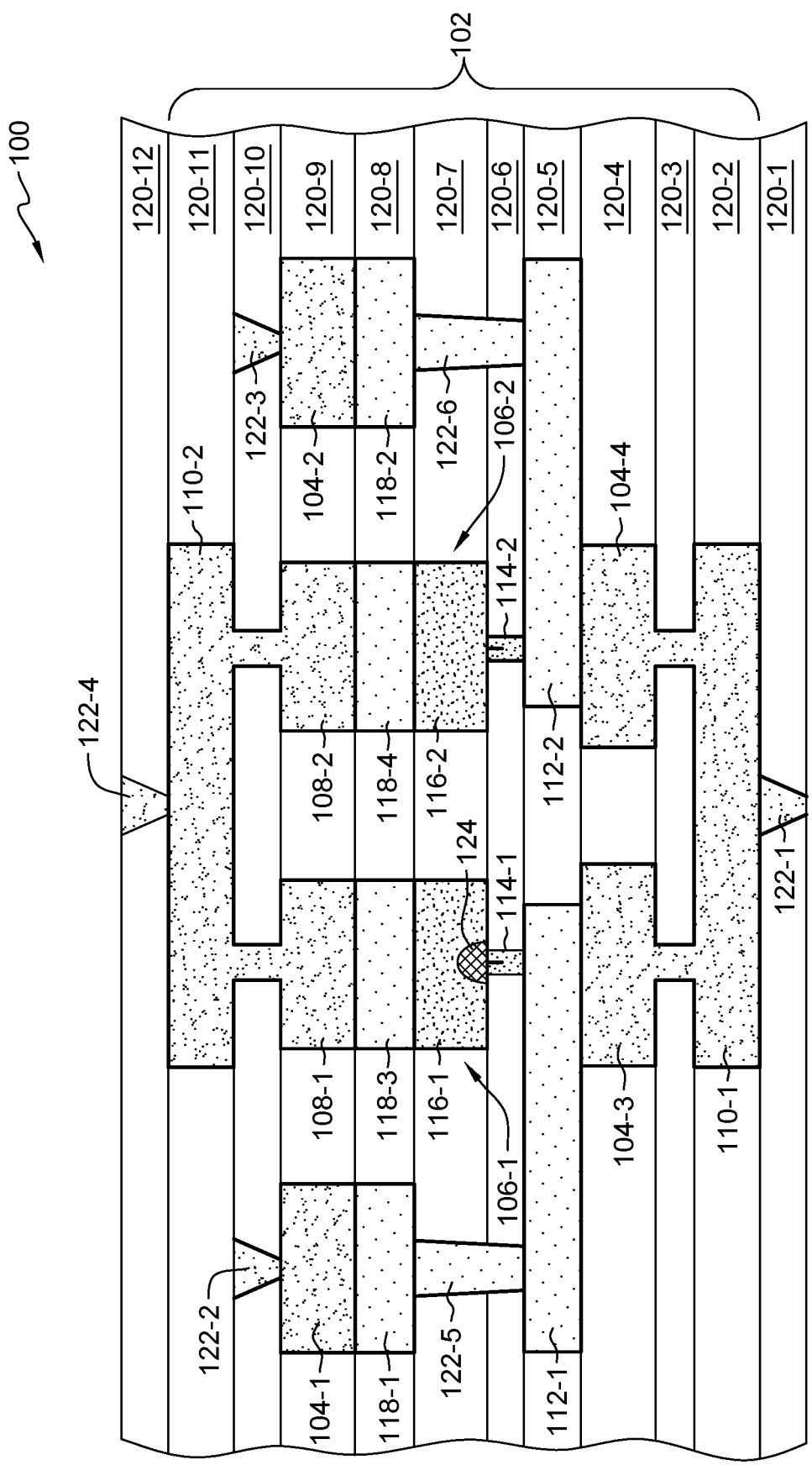
FIG. 1 is a cross-section view of an integrated circuit including a "not-and" (NAND) logic gate memory device (LGMD) including phase change memory (PCM) material, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

FIG. 1 is a cross-section view of integrated circuit 100 including "not-and" (NAND) logic gate memory device (LGMD) 102. In the illustrated embodiment, LGMD 102 comprises inputs 104-1-104-4 (collectively, "inputs 104"), PCM cells 106-1 and 106-2 (collectively "PCM cells 106"), outputs 108-1 and 108-2 (collectively "outputs 108"), and bridges 110-1 and 110-2 (collectively "bridges 110"). PCM cells 106-1 and 106-2 comprise, respectively, bottom electrodes 112-1 and 112-2 (collectively, "bottom electrodes 112"), heaters 114-1 and 114-2 (collectively, "heaters 114"), PCM material 116-1 and 116-2 (collectively, "PCM material 116"), and top electrodes 118-1-118-4 (collectively, "top electrodes 118").

In the illustrated embodiment, integrated circuit 100 is formed of a plurality of layers 120-1-120-12 (collectively, "layers 120"), and the components of LGMD 102 are positioned in various layers 120. For example, PCM cells 106-1 and 106-2 extend through layers 120-4-120-8. For another example, inputs 104-1 and 104-2 are in layer 120-9, while inputs 104-3 and 104-4 are in layer 120-4. In addition, LGMD 102 can be connected to other components (e.g., silicon transistors, not shown) in integrated circuit 100 by vias 122-1-122-4 which connect to inputs 104-1 and 104-2 and to bridges 110, respectively.

In the illustrated embodiment, input 104-1 is electrically connected to bottom electrode 112-1 through top electrode 118-1 and via 122-5, which are adjacent and electrically connected to each other, respectively. Bottom electrode 112-1 is adjacent and electrically connected to PCM cell 106-1, specifically to heater 114-1. Heater 114-1 is adjacent and electrically connected to PCM material 116-1. PCM material 116-1 is adjacent and electrically connected to top electrode 118-3. Top electrode 118-3 is adjacent and electrically connected to output 108-1. Output 108-1 is adjacent and electrically connected to bridge 110-2. Furthermore, input 104-2 is electrically connected to bottom electrode 112-2 through top electrode 118-2 and via 122-6, which are adjacent and electrically connected to each other, respectively. Bottom electrode 112-2 is adjacent and electrically connected to PCM cell 106-2, specifically to heater 114-2. Heater 114-2 is adjacent and electrically connected to PCM material 116-2. PCM material 116-2 is adjacent and electrically connected to top electrode 118-4. Top electrode 118-4 is adjacent and electrically connected to output 108-2. Output 108-2 is adjacent and electrically connected to bridge 110-2. Furthermore, inputs 104-3 and 104-4 are adjacent and electrically connected to bridge 110-1. Input 104-3 is adjacent and electrically connected to bottom electrode 112-1, and input 104-4 is adjacent and electrically connected to bottom electrode 112-2. In addition, heaters 114 are substantially narrower than PCM materials 116, so PCM cells 106 are of the "mushroom" type in this example. However, other types of PCM cells 106 can be used in other embodiments.

Inputs 104, outputs 108, and bridges 110 can be comprised of highly electrically conductive material, such as, for example, copper (Cu). Bottom electrodes 112 and top electrodes 118 are comprised of an electrically conductive material, such as metal, for example, titanium nitride (TiN) or tungsten (W). Heaters 114 are electrodes that are comprised of a high resistance metal, such as, for example, TiN, and have a relatively narrow cross-sectional area, which focus electrical current that is run through PCM cells 106, respectively. This allows heaters 114 to generate heat through resistive heating during a pulse of electricity, which can be used to selectively change the temperatures of PCM materials 116, respectively, for example, above the crystallization temperature and the melting temperature of PCM materials 116. In addition, heaters 114 can be comprised of multiple different electrically conductive materials that can be arranged in multiple layers.

PCM materials 116 can be composed essentially of a phase change material such as a germanium-antimony-tellurium (GST), gallium-antimony-tellurium (GaST), or silver-iridium-antimony-telluride (AIST) material, although other materials can be used as appropriate. In addition, PCM materials 116-1 and 116-2 are the same in some embodiments, and they are different in other embodiments. The terms "composed essentially" and "consist essentially," as used herein with respect to materials of different layers, indicates that other materials, if present, do not materially alter the basic characteristics of the recited materials. For example, a PCM material 116 consisting essentially of GST material does not include other materials that materially alter the basic characteristics of the GST material.

In the illustrated embodiment, PCM cells 106 can be written and rewritten as independent memory cells by passing an electrical current pulse from heaters 114-1 and 114-2 to top electrodes 118-3 and 118-4, respectively. This can be done at a variety of voltages to read or write values on PCM cells 106. More specifically, inputs 104-1 and 104-2 are configured to provide writing electrical current pulses, and inputs 104-3 and 104-4 are configured to provide reading electrical current pulses. For example, to write, a high voltage current can be used (e.g., 1 volt (V) to 4 V) for a short period of time, which can cause PCM material 116-1 to heat up beyond its melting point. Once the flow of current ceases, PCM cell 106-1 can cool down rapidly, which forms zone 124 in a process called "resetting". Zone 124 is a dome-shaped region of PCM material 116 having an amorphous configuration, although the remainder of PCM material 116 outside of zone 124 is still in a polycrystalline configuration. In general, this amorphous configuration has no definite structure. However, there can be local, disjoint crystalline nuclei (i.e., small crystallized regions of PCM material 116) present in zone 124. The creation of zone 124 can cause the electrical resistance across PCM cell 106-1 to increase as compared to a solely polycrystalline configuration (e.g., of PCM cell 106-2). However, the resistance values of PCM cells 106 can be read as a single unit using current at a low voltage (e.g., 0.2 V) without changing the state of PCM materials 116 or the resistance values of PCM cells 106. This can occur because the reading pulses originate at bridge 110-1 and end at bridge 110-2.

In addition, PCM material 116-1 can be rewritten and returned back to a solely polycrystalline configuration by "setting" PCM cell 106-1. To rewrite PCM material 116-1, a high voltage electrical pulse can be used (e.g., 1 V to 4 V) for a short period of time (e.g., 10 nanoseconds (ns)), which can cause PCM material 116-1 to heat up beyond its crystallization point but not to its melting point. Since the crystallization temperature is lower than the melting temperature, once the flow of current ceases, PCM material 116-1 can anneal and form crystals. This can cause the electrical resistance across PCM cell 106-1 to decrease as compared to having an amorphous zone 124 (a la PCM cell 106-2). This new resistance value can then be read using current at a low voltage (e.g., 0.2 V) without changing the state of PCM material 116-1 or the resistance value of PCM cell 106-1.

In some embodiments, the melting temperature of PCM materials 116 can be about 600 degrees Celsius (° C.). In some embodiments, the crystallization temperature of PCM materials 116 can be about 180° C. In addition, the process of setting and resetting PCM cells 106 can occur repeatedly, and in some embodiments, different zones 124 with different resistances can be created in PCM materials 116 (e.g., due to having different sizes of zone 124 and/or amounts of crystallization nuclei in zone 124). This allows for PCM cells 106 to have various distinct resistances that can be created by varying the resetting parameters. Thereby, if PCM cells 106 are considered to represent information digits, these digits can be non-binary (as opposed to traditional bits). However, in some embodiments, PCM cells 106 can be used as bits by either having or not having a uniform zone 124 in PCM materials 116, respectively. Thereby, PCM cells 106 can have a high resistance (a.k.a, low voltage output or "0") or low resistance (a.k.a., high voltage output or "1").

Furthermore, the arrangement of having two parallel PCM cells 106 with two independent inputs 104-1 and 104-2, respectively, allows for LGMD 102 to function as a reversible, rewritable, and/or programmable resistive memory device that can store the result of a NAND logic operation performed by LGMD 102. The logical result can be determined without using a silicon substrate and can be stored without consuming electrical power.

Such operation of LGMD 102 is shown in FIGS. 2A-2H, which include a series of cross-section views of NAND LGMD 102 in different states. FIGS. 2A-2H should be viewed in pairs because the operation of LGMD 102 occurs in two stages. The first stage is writing/programming (or not writing/programming, if the inputs are "false") (as shown in FIGS. 2A, 2C, 2E, and 2G), and the second stage is reading (as shown in views 2B, 2D, 2F, and 2H).

Figure 2A:
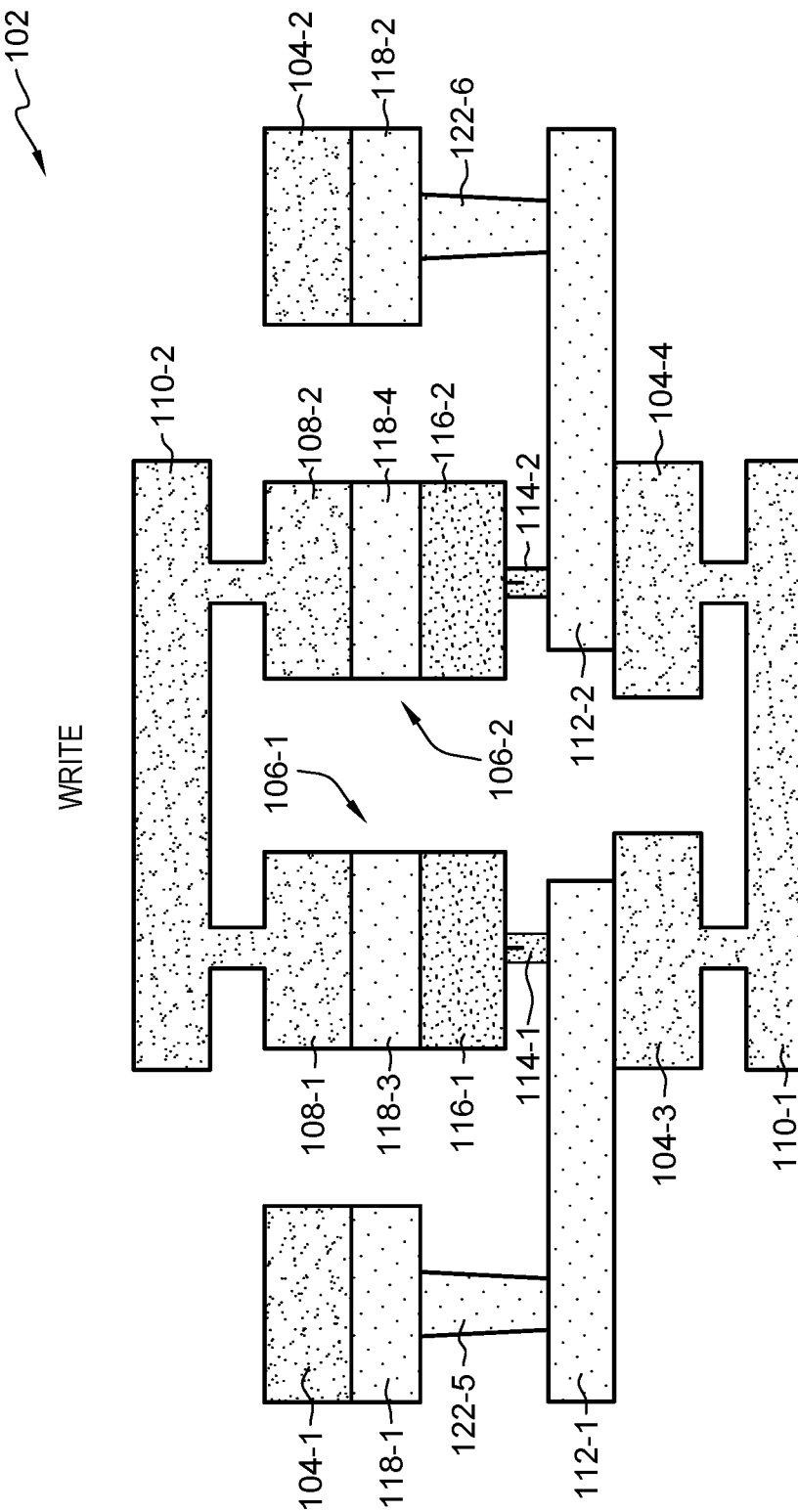
FIGS. 2A-2H are a series of cross-section views of the NAND LGMD in different states, in accordance with an embodiment of the present disclosure.

FIG. 2A shows LGMD 102 in a state wherein PCM materials 116 are both crystalline (a.k.a., set), so the electrical resistances across PCM cells 106 are low. This can be the initial state of LGMD 102, or it can be the result of a setting current pulse having been applied to both PCM materials 116, for example, after a logic gate result is no longer needed, to prepare LGMD 102 for a new operation. Subsequently, this state can be maintained given a "false" (a.k.a., 0) input at both inputs 104-1 and 104-2 such that zero current was applied to reset PCM materials 116.

Figure 2B:
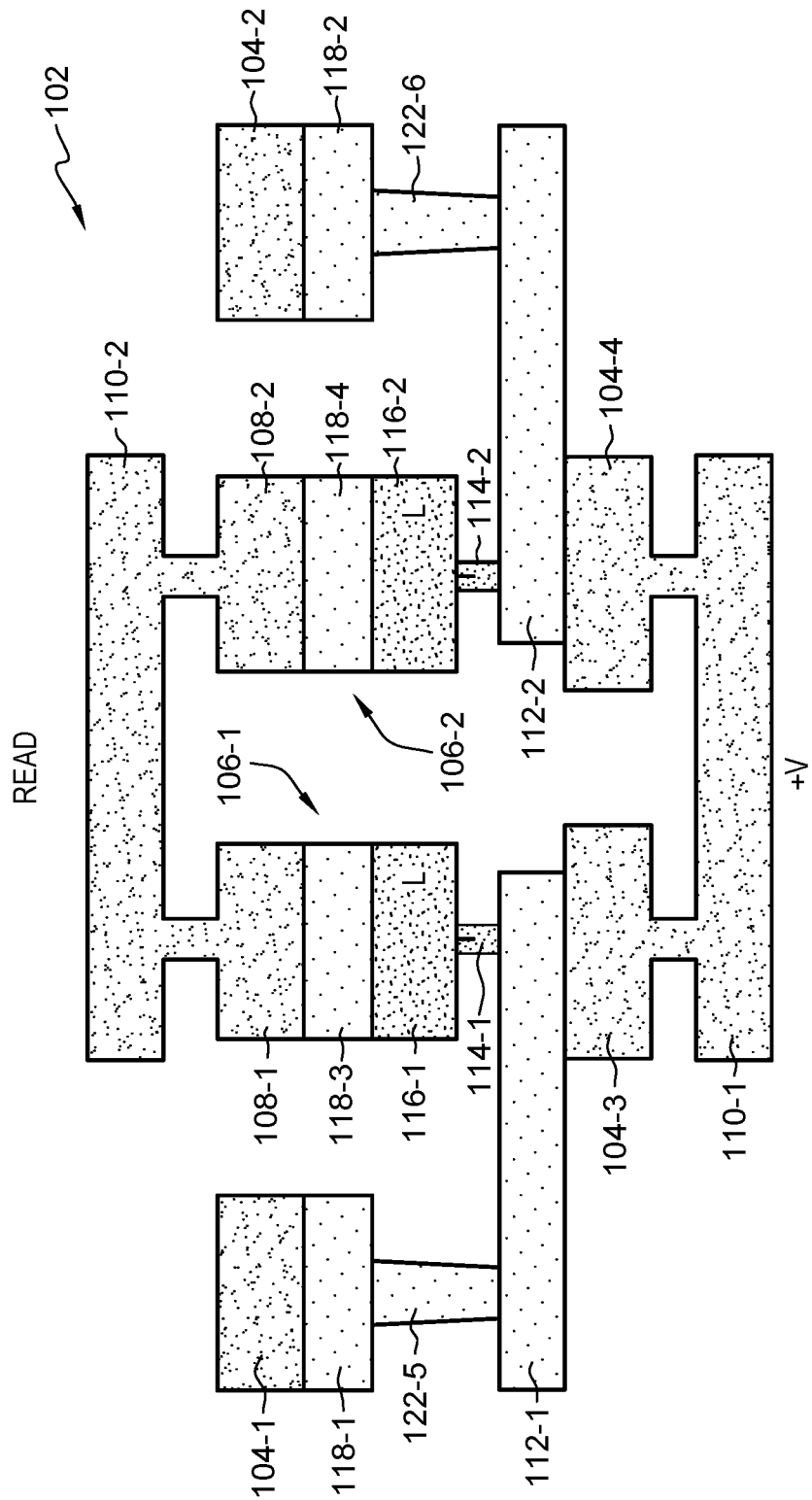

FIG. 2B shows LGMD 102 being read, wherein the voltage drop from bridge 110-1 to bridge 110-2 is measured. The result of the reading is that there is a high voltage output (a.k.a., a low voltage drop) through LGMD 102 due to its low resistance. Thereby, a "true" (a.k.a., 1) result is returned.

Figure 2C:
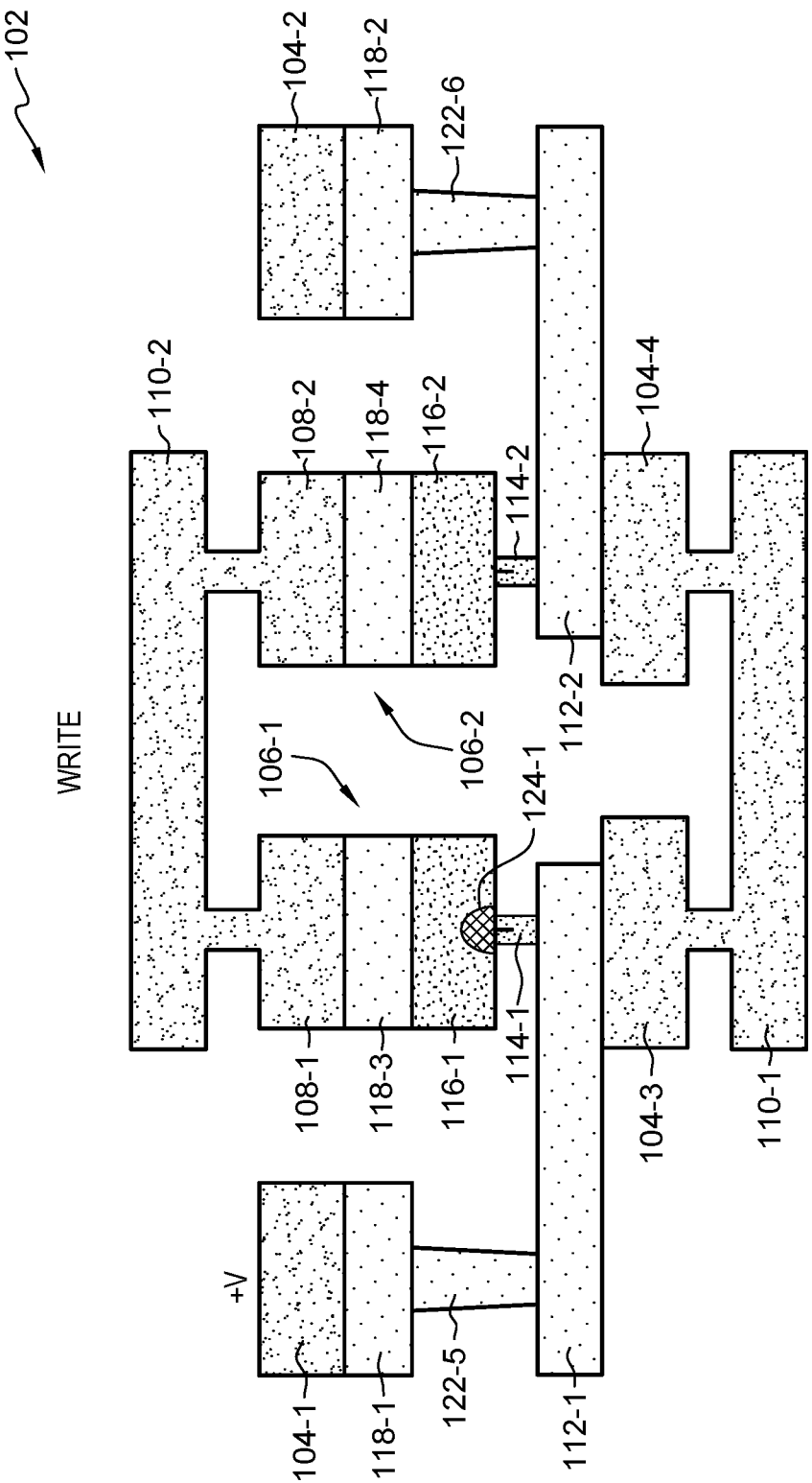

FIG. 2C shows LGMD 102 in a state wherein PCM material 116-1 includes amorphous (a.k.a., reset) zone 124-1 and PCM material 116-2 is crystalline. So, the electrical resistance across PCM cell 106-1 is high but PCM cell 106-2 is low. This can be the result of a "true" input at input 104-1 such that a resetting current pulse was applied to PCM material 116-1, but there was a "false" input at input 104-2.

Figure 2D:
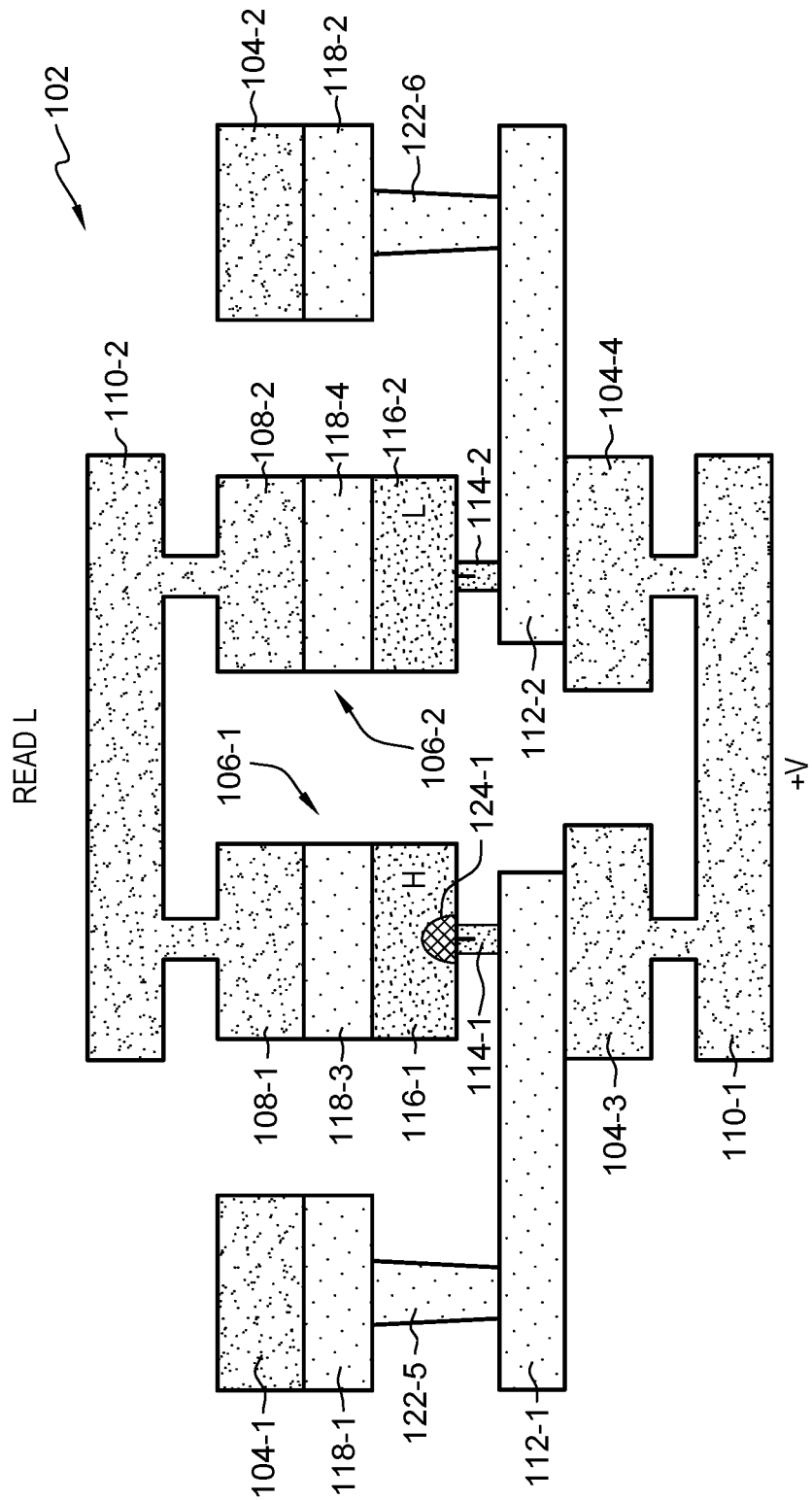

FIG. 2D shows LGMD 102 being read, wherein the voltage drop from bridge 110-1 to bridge 110-2 is measured. The result of the reading is that there is a high voltage output through LGMD 102 due to the low resistance pathway through PCM cell 106-2. Thereby, a "true" result is returned.

Figure 2E:
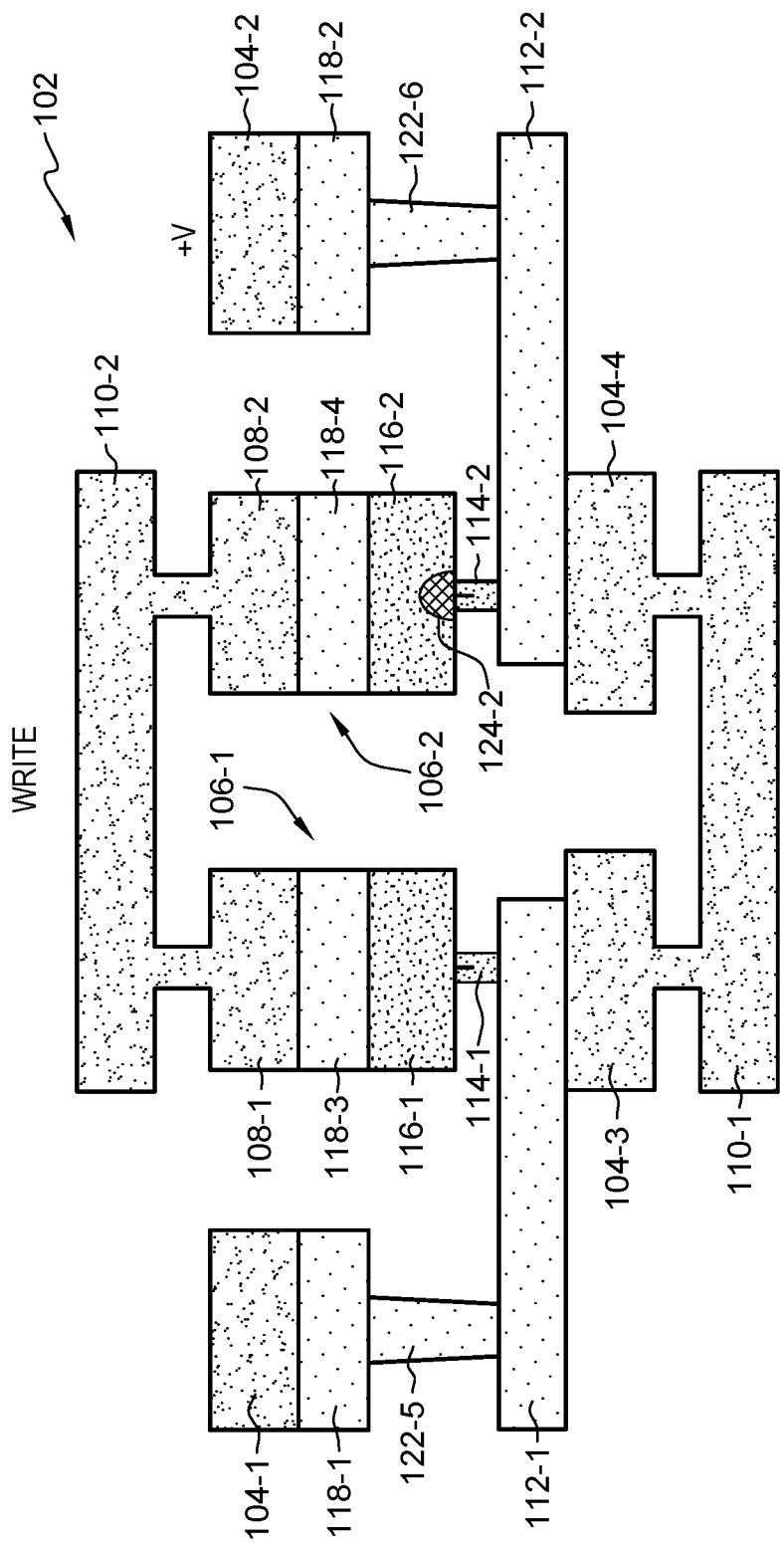

FIG. 2E shows LGMD 102 in a state wherein PCM material 116-1 is crystalline and PCM material 116-2 includes amorphous zone 124-2. So, the electrical resistance across PCM cell 106-1 is low, but the electrical resistance across PCM cell 106-2 is high. This can be the result of a "true" input at input 104-2 such that a resetting current pulse was applied to PCM material 116-2, but there was a "false" input at input 104-1.

Figure 2F:
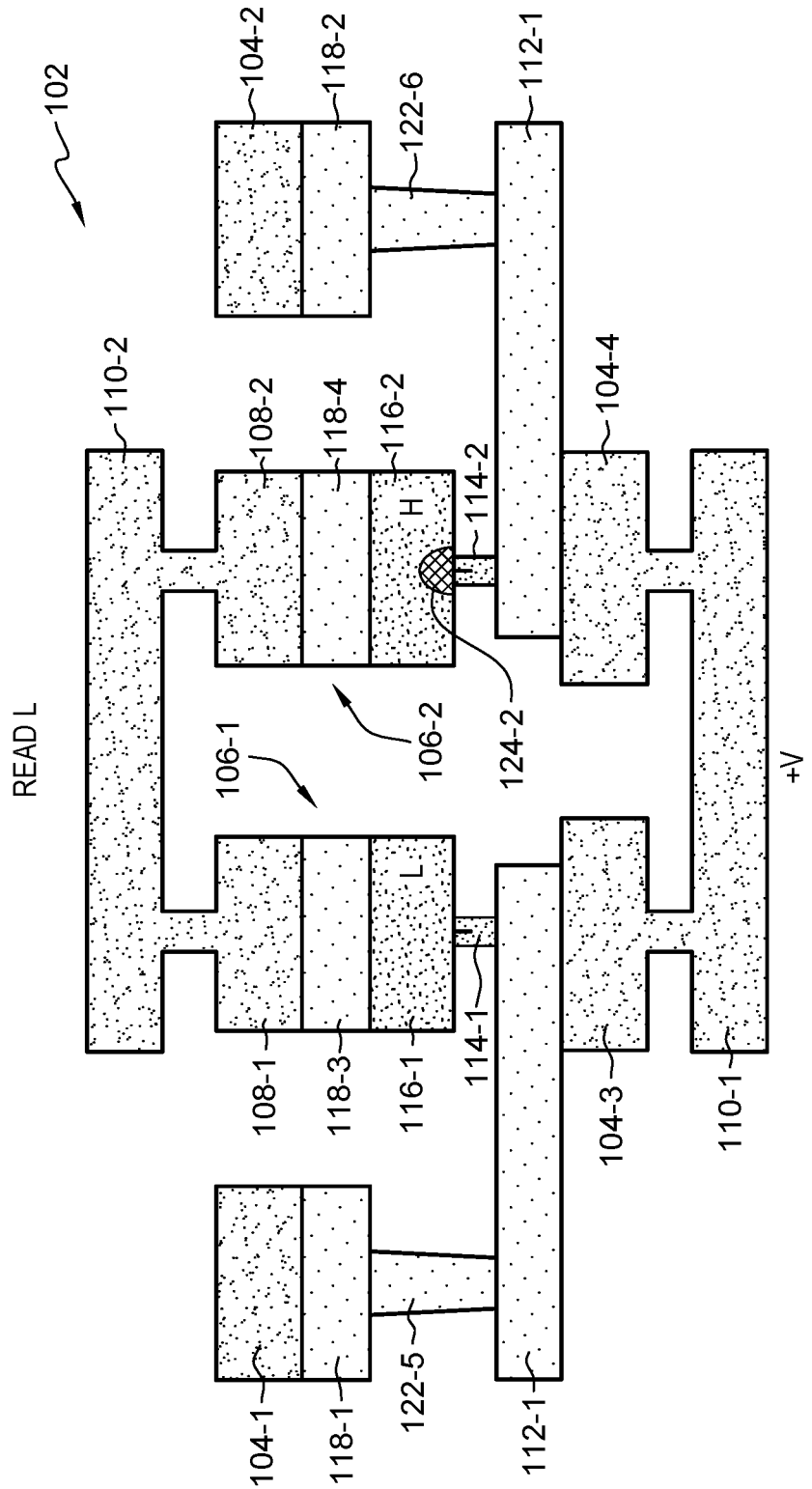

FIG. 2F shows LGMD 102 being read, wherein the voltage drop from bridge 110-1 to bridge 110-2 is measured. The result of the reading is that there is a high voltage output through LGMD 102 due to the low resistance pathway through PCM cell 106-1. Thereby, a "true" result is returned.

Figure 2G:
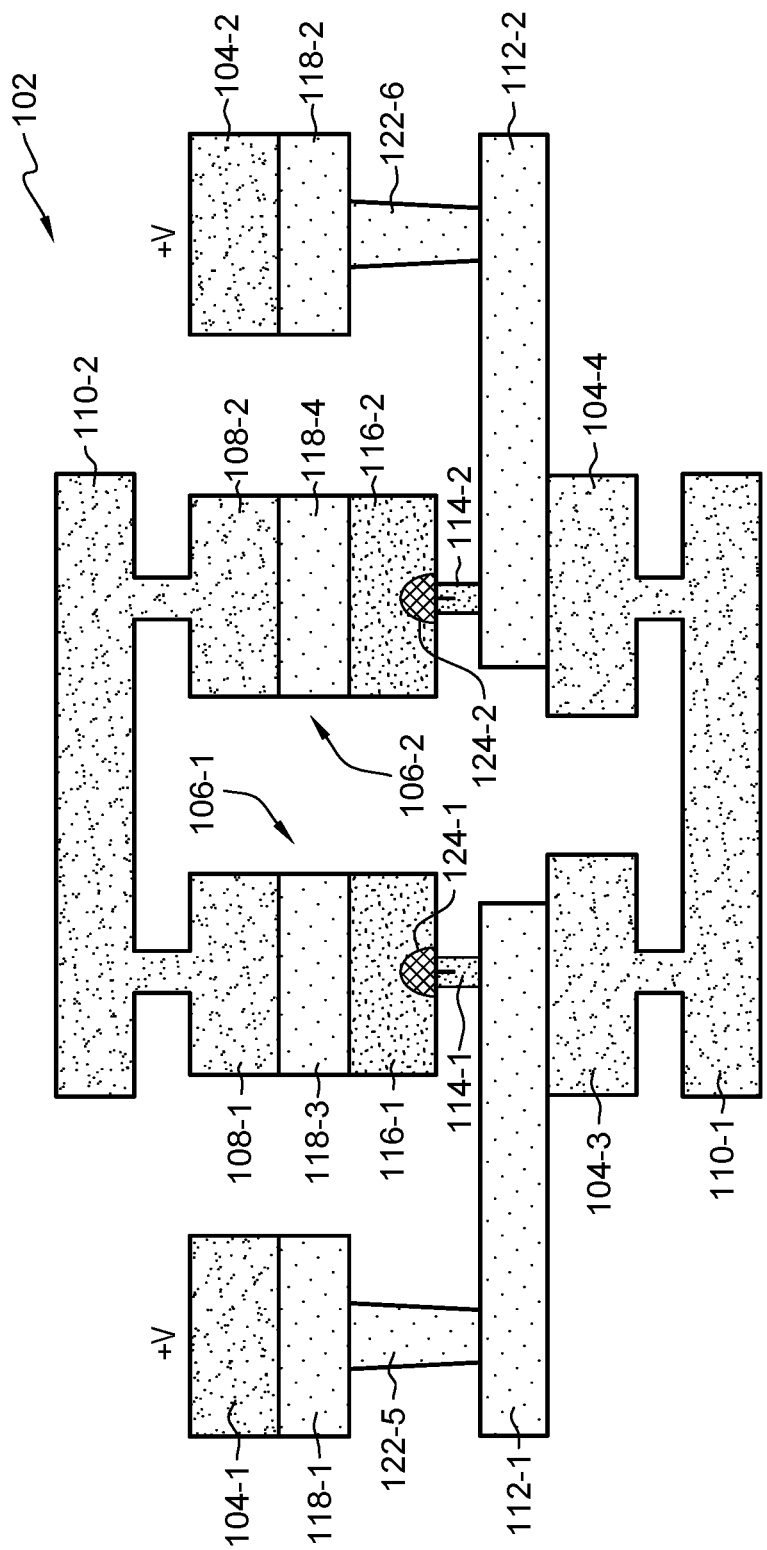

FIG. 2G shows LGMD 102 in a state wherein PCM materials 116 both include amorphous zones 124, respectively, so the electrical resistances across both PCM cells 106 are high. This can be the result of a "true" input at both inputs 104-1 and 104-2 such that resetting current pulses were applied to both PCM materials 116.

Figure 2H:
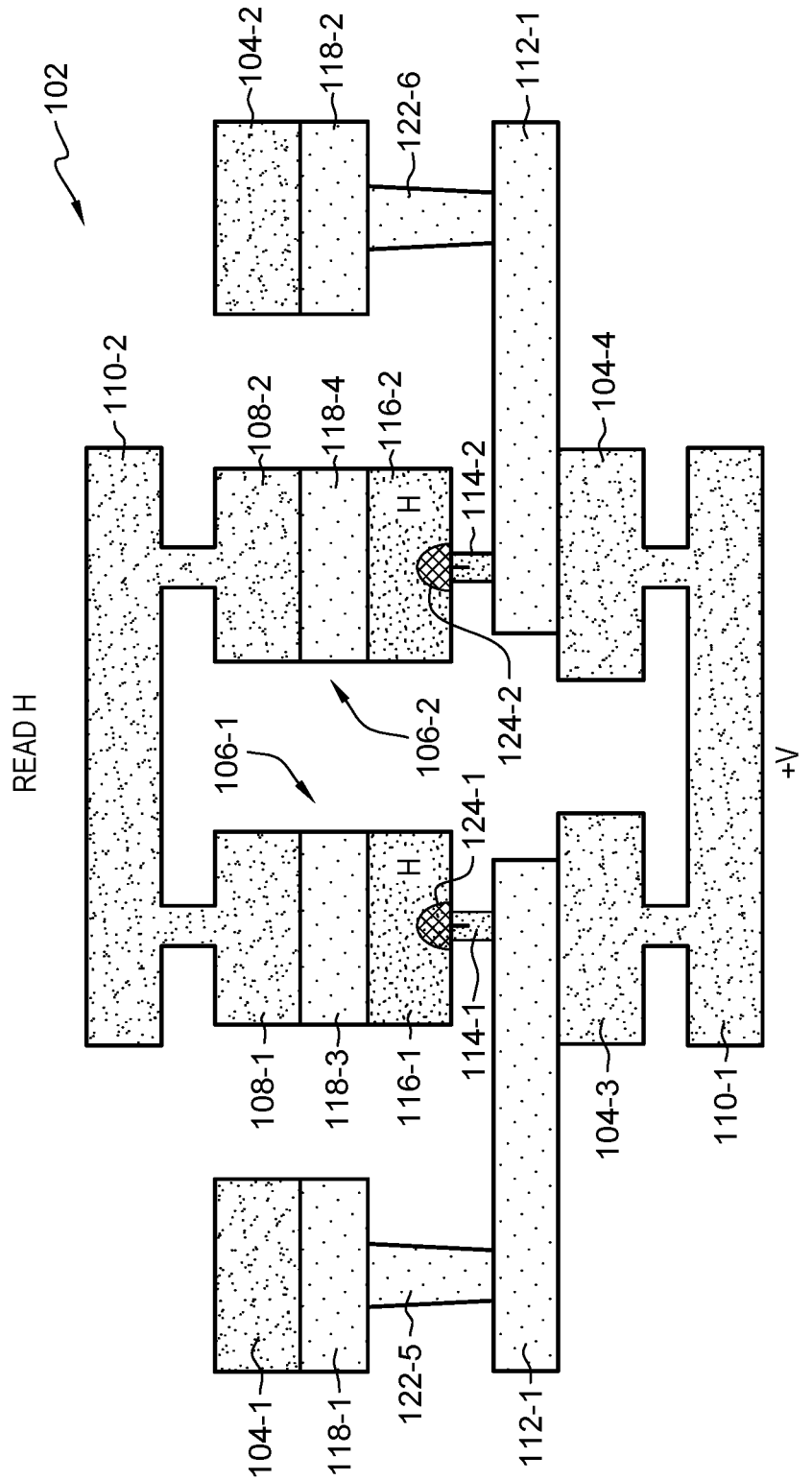

FIG. 2H shows LGMD 102 being read, wherein the voltage drop from bridge 110-1 to bridge 110-2 is measured. The result of the reading is that there is a low voltage output (a.k.a., a high voltage drop) through LGMD 102 due to both pathways through PCM cells 106 having high resistance. Thereby, a "false" result is returned.

Thereby, LGMD 102 presents the characteristic responses of a NAND gate:
(FIGS. 2A and 2B) Inputs: 0+0; Output:1
(FIGS. 2C and 2D) Inputs: 1+0; Output:1
(FIGS. 2E and 2F) Inputs: 0+1; Output:1
(FIGS. 2G and 2H) Inputs: 1+1; Output:0

Therefore, LGMD 102 can function as a logic gate during the writing stage using inputs 104-1 and 104-2. After that stage has been completed, the result of the NAND logic operation can be stored in LGMD 102 without needing electrical power. Then, the result can be retrieved by reading LGMD 102 using inputs 104-3 and 104-4 (e.g., via bridge 110-1).

Figure 3:
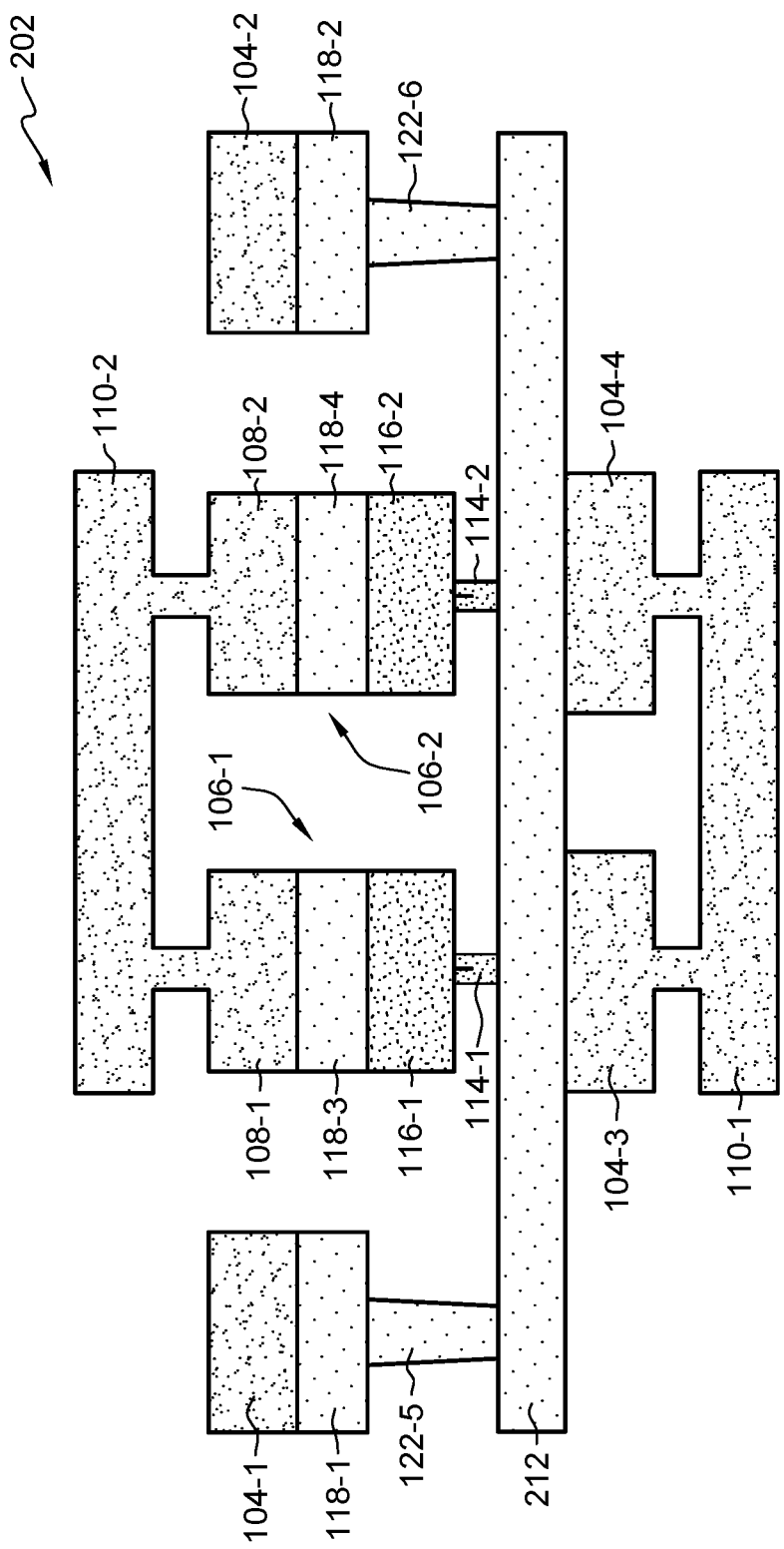
FIG. 3 is a cross-section view of a "not-or" (NOR) LGMD including PCM material, in accordance with an embodiment of the present disclosure.

FIG. 3 is a cross-section view of "not-or" (NOR) LGMD 202. In the illustrated embodiment, LGMD 202 is the same as LGMD 102 (shown in FIG. 1) except the two separate bottom electrodes 112 (shown in FIG. 1) have been combined into a single bottom electrode 212. Thereby, the same reference numerals will be used for LGMD 202 where the corresponding components are the same as in LGMD 102. However, reference numerals that are one hundred higher are used for components of LGMD 202 that are different from those in LGMD 102.

Figure 4A:
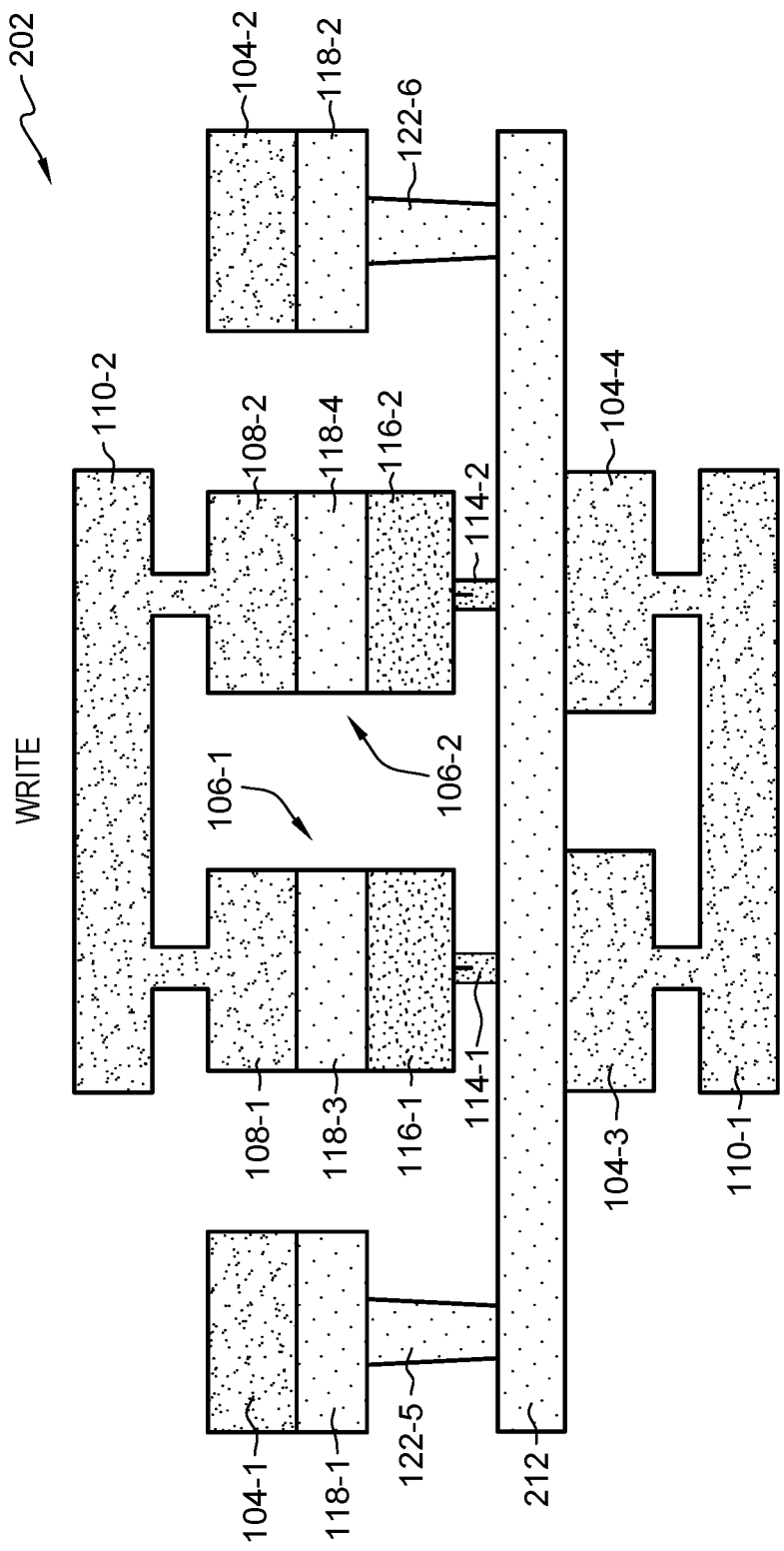

The consequences of the difference between LGMD 202 and LGMD 102 are demonstrated in FIGS. 4A-4H, which are a series of cross-section views of NOR LGMD 202 in different states. FIG. 4A shows LGMD 202 in a state wherein PCM materials 116 are both crystalline (a.k.a., set), so the electrical resistances across PCM cells 106 are low. This can be the initial state of LGMD 202, or it can be the result of a setting current pulse having been applied to both PCM materials 116, for example, after a logic gate result is no longer needed, to prepare LGMD 202 for a new operation. Subsequently, this state can be maintained given a "false" (a.k.a., 0) input at both inputs 104-1 and 104-2 such that zero current was applied to reset PCM materials 116.

Figure 4B:
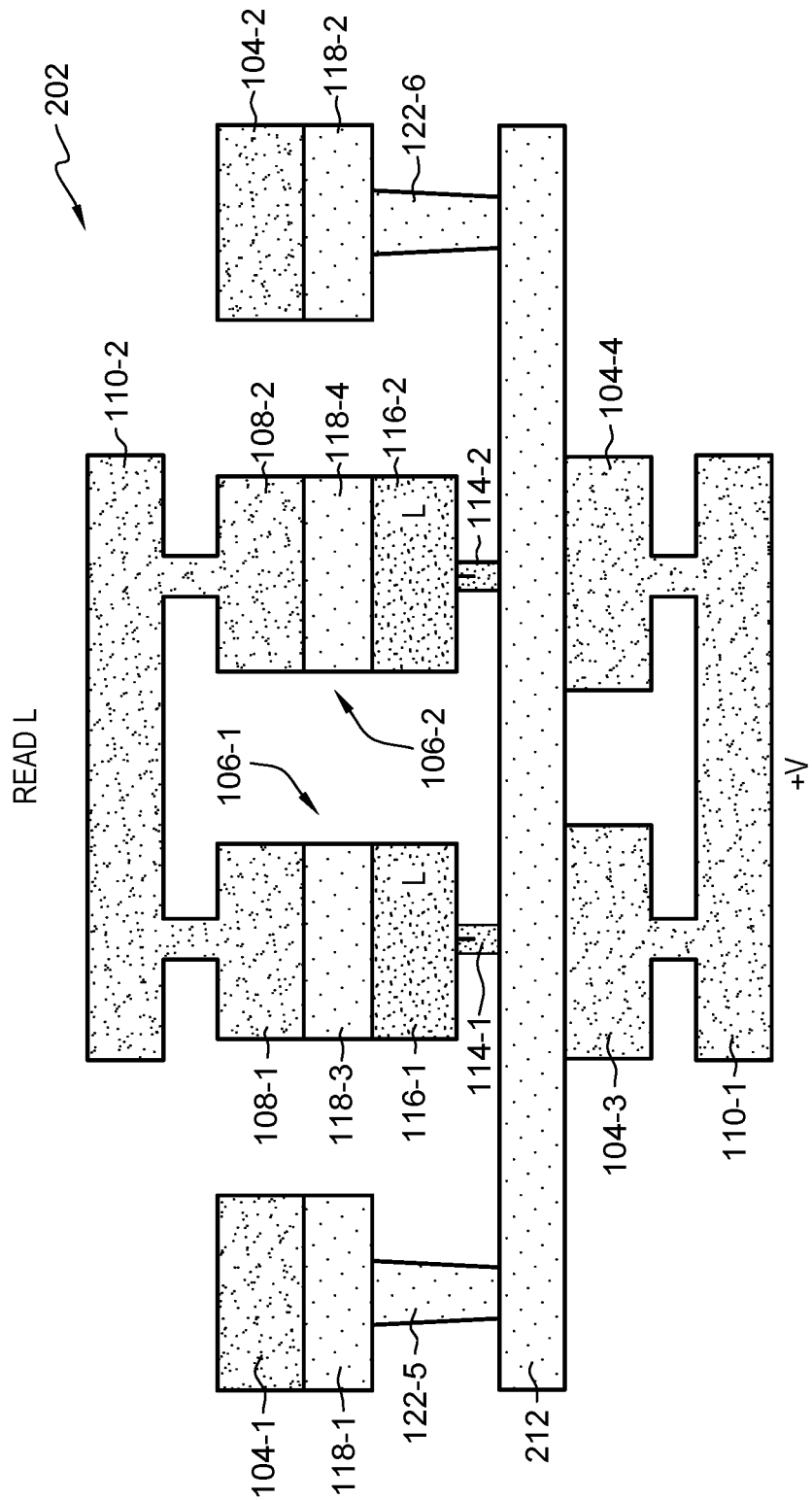

FIG. 4B shows LGMD 202 being read, wherein the voltage drop from bridge 110-1 to bridge 110-2 is measured. The result of the reading is that there is a high voltage output (a.k.a., a low voltage drop) through LGMD 202 due to its low resistance. Thereby, a "true" (a.k.a., 1) result is returned.

Figure 4C:
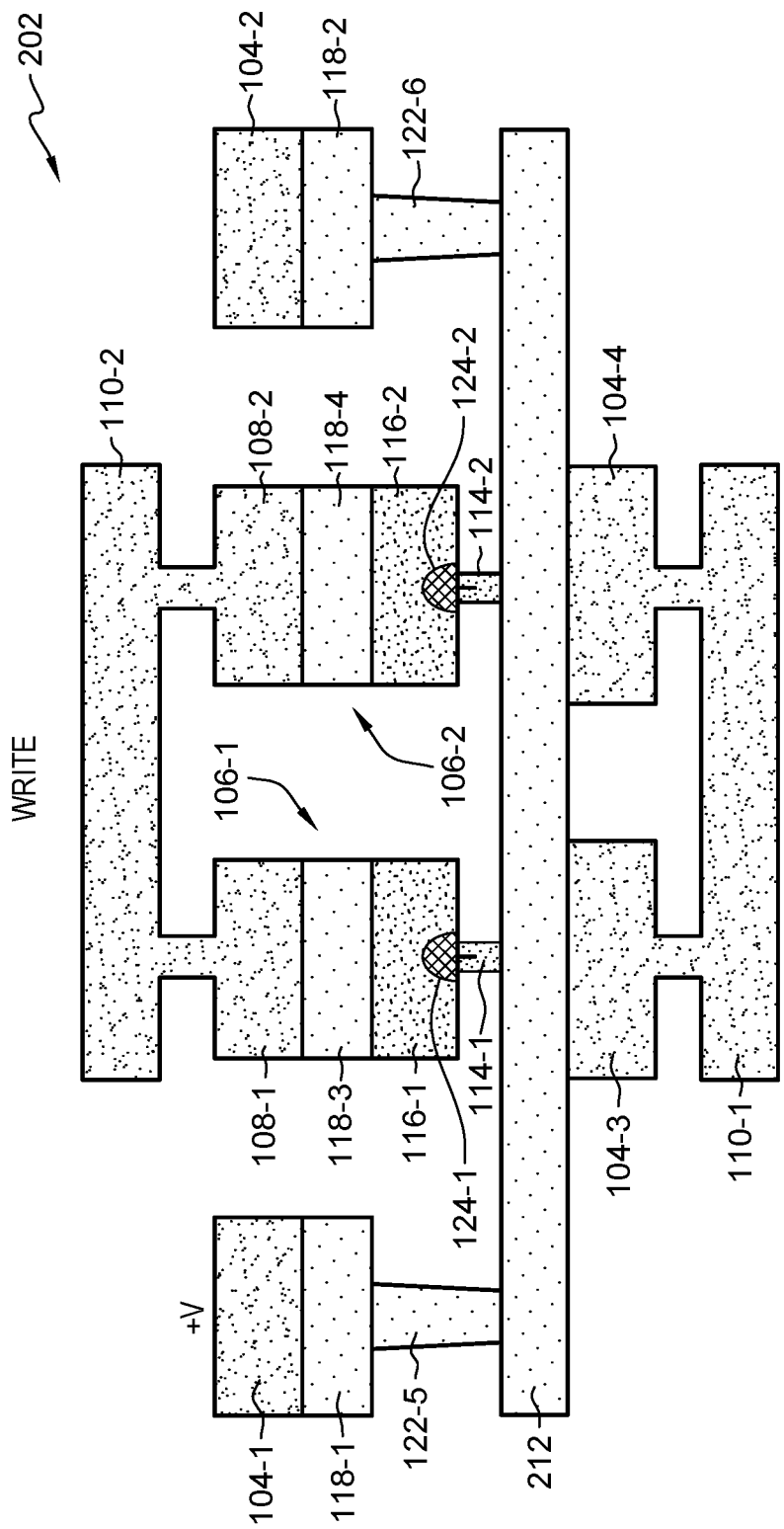

FIG. 4C shows LGMD 202 in a state wherein PCM materials 116 both include amorphous zones 124, respectively. So, the electrical resistance across both PCM cells 106 is high. This can be the result of a "true" input at input 104-1 and a "false" input at input 104-2 because bottom electrode 218 connects input 104-1 to both PCM cells 106. Therefore, a resetting current pulse from input 104-1 is able to reset both PCM materials 116.

Figure 4D:
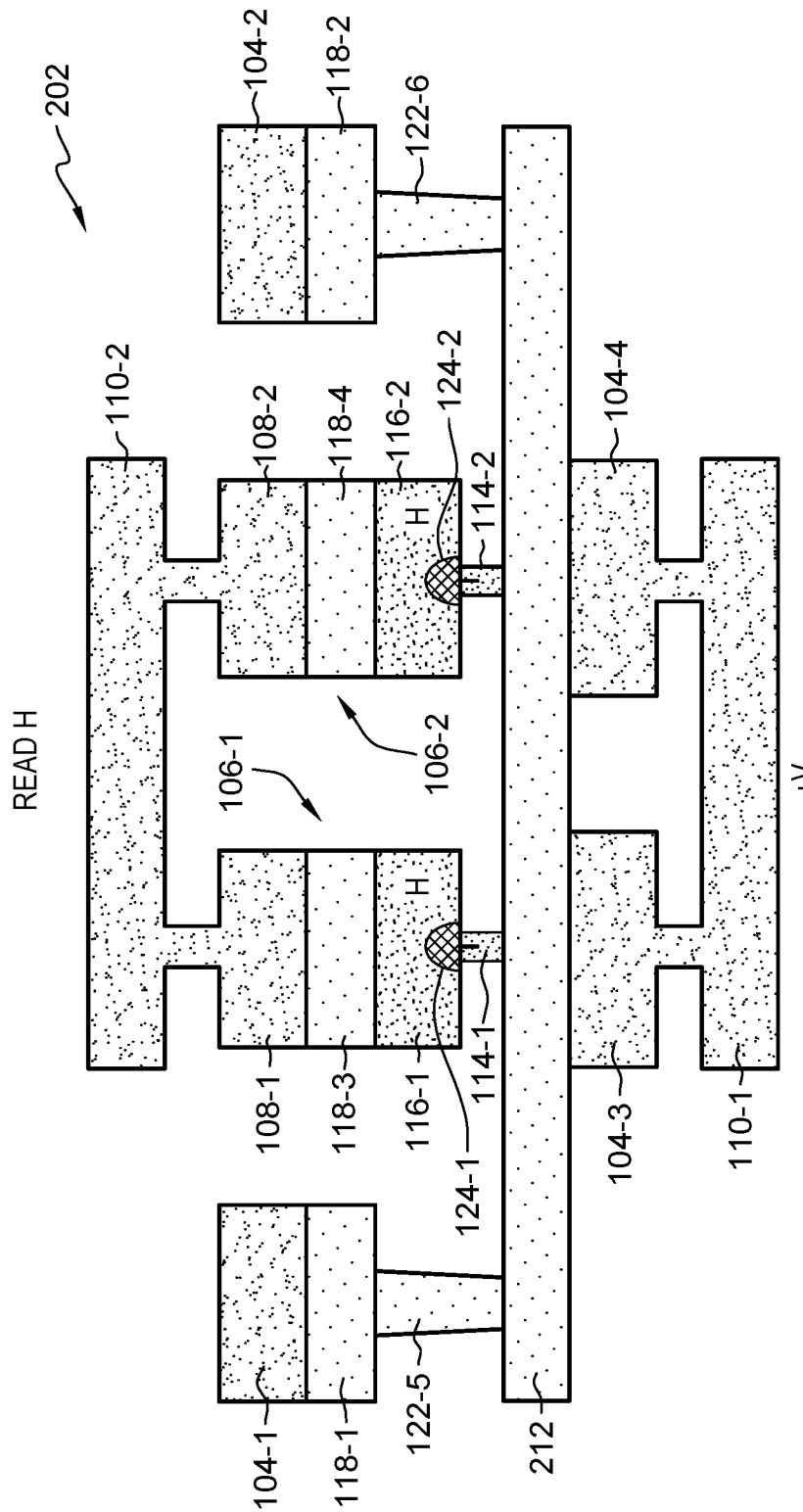

FIG. 4D shows LGMD 202 being read, wherein the voltage drop from bridge 110-1 to bridge 110-2 is measured. The result of the reading is that there is a low voltage output through LGMD 202 due to both pathways through PCM cells 106 having high resistance. Thereby, a "false" result is returned.

Figure 4E:
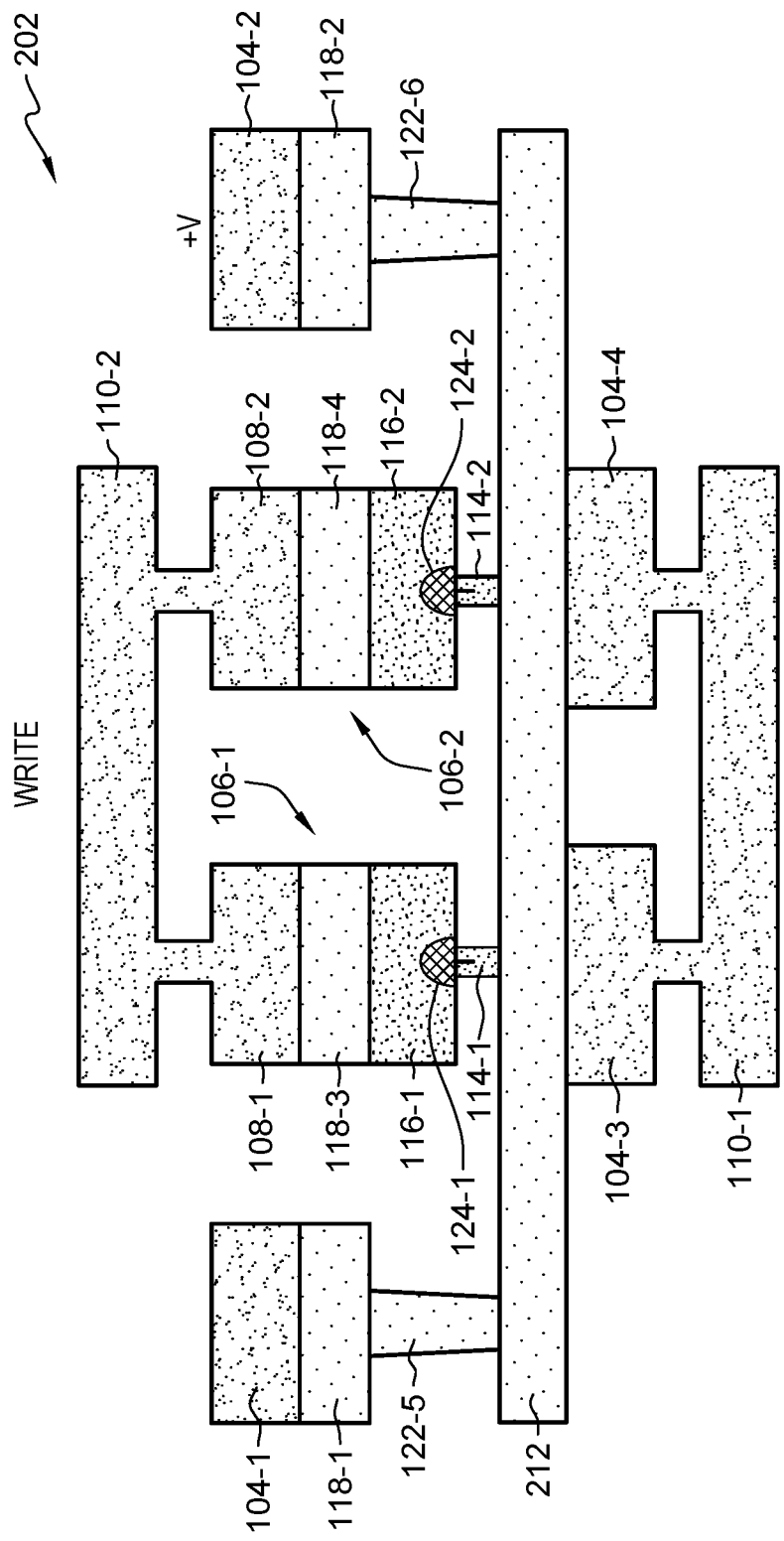

FIG. 4E shows LGMD 202 in a state wherein PCM materials 116 both include amorphous zones 124, respectively. So, the electrical resistance across both PCM cells 106 is high. This can be the result of a "false" input at input 104-1 and a "true" input at input 104-2 because bottom electrode 218 connects input 104-2 to both PCM cells 106. Therefore, a resetting current pulse from input 104-2 is able to reset both PCM materials 116.

FIG. 4F shows LGMD 202 being read, wherein the voltage drop from bridge 110-1 to bridge 110-2 is measured. The result of the reading is that there is a low voltage output through LGMD 202 due to both pathways through PCM cells 106 having high resistance. Thereby, a "false" result is returned.

Figure 4G:
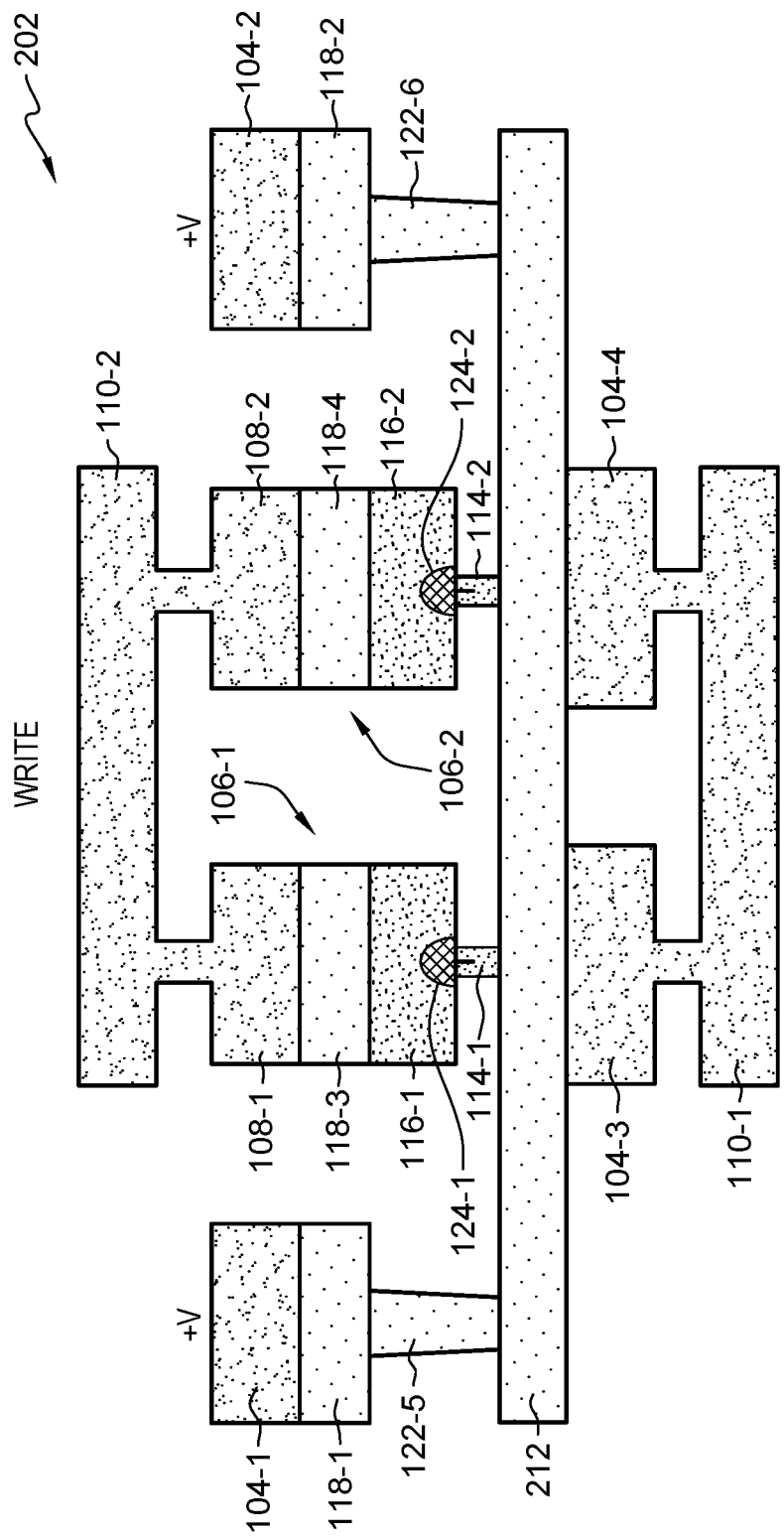

FIG. 4G shows LGMD 202 in a state wherein PCM materials 116 both include amorphous zones 124, respectively, so the electrical resistances across both PCM cells 106 are high. This can be the result of a "true" input at both inputs 104-1 and 104-2 such that resetting current pulses were applied to both PCM materials 116.

Figure 4H:
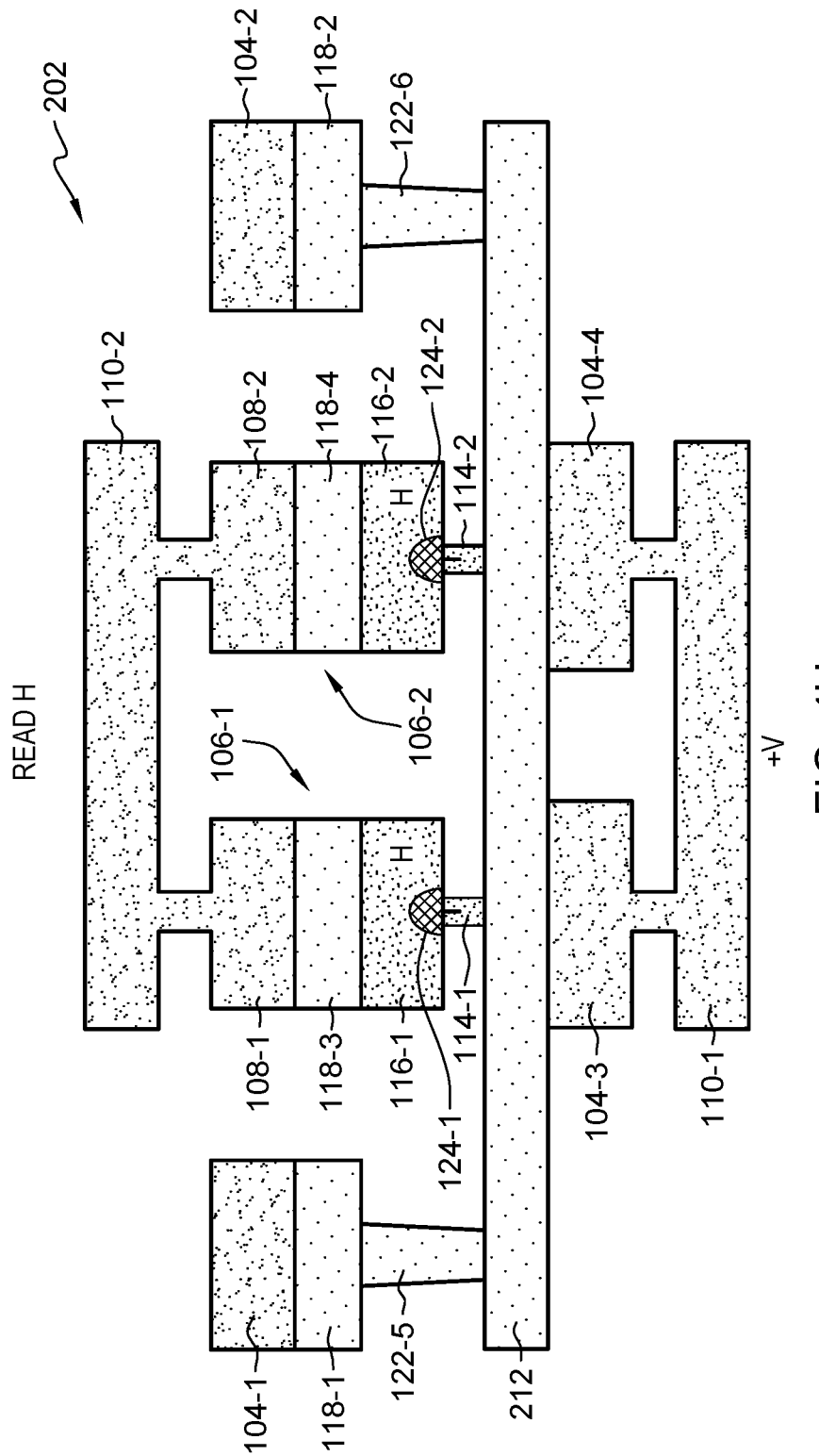

FIG. 4H shows LGMD 202 being read, wherein the voltage drop from bridge 110-1 to bridge 110-2 is measured. The result of the reading is that there is a low voltage output (a.k.a., a high voltage drop) through LGMD 102 due to both pathways through PCM cells 106 having high resistance. Thereby, a "false" result is returned.

Thereby, LGMD 202 presents the characteristic responses of a NOR gate:
(FIGS. 4A and 4B) Inputs: 0+0; Output:1
(FIGS. 4C and 4D) Inputs: 1+0; Output:0
(FIGS. 4E and 4F) Inputs: 0+1; Output:0
(FIGS. 4G and 4H) Inputs: 1+1; Output:0

Therefore, LGMD 202 can function as a logic gate during the writing stage using inputs 104-1 and 104-2. After that stage has been completed, the result of the NOR logic operation can be stored in LGMD 202 without needing electrical power. Then, the result can be retrieved by reading LGMD 202 using inputs 104-3 and 104-4 (e.g., via bridge 110-1).

FIGS. 5A-5D is a series of cross-section views of "not" (NOT) LGMD 302 in various states. In the illustrated embodiment, LGMD 302 is the same as LGMD 202 (shown in FIG. 3) except there is only a single writing input (i.e., input 104-1). Thus, bottom electrode 312 has been shortened because input 104-2, top electrode 118-2, and via 122-6 (shown in FIG. 1) are absent. Thereby, the same reference numerals will be used for LGMD 302 where the corresponding components are the same as in LGMDs 102 and 202. However, reference numerals that are two hundred or one hundred higher are used for components of LGMD 302 that are different from those in LGMDs 102 and 202, respectively.

Figure 5A:
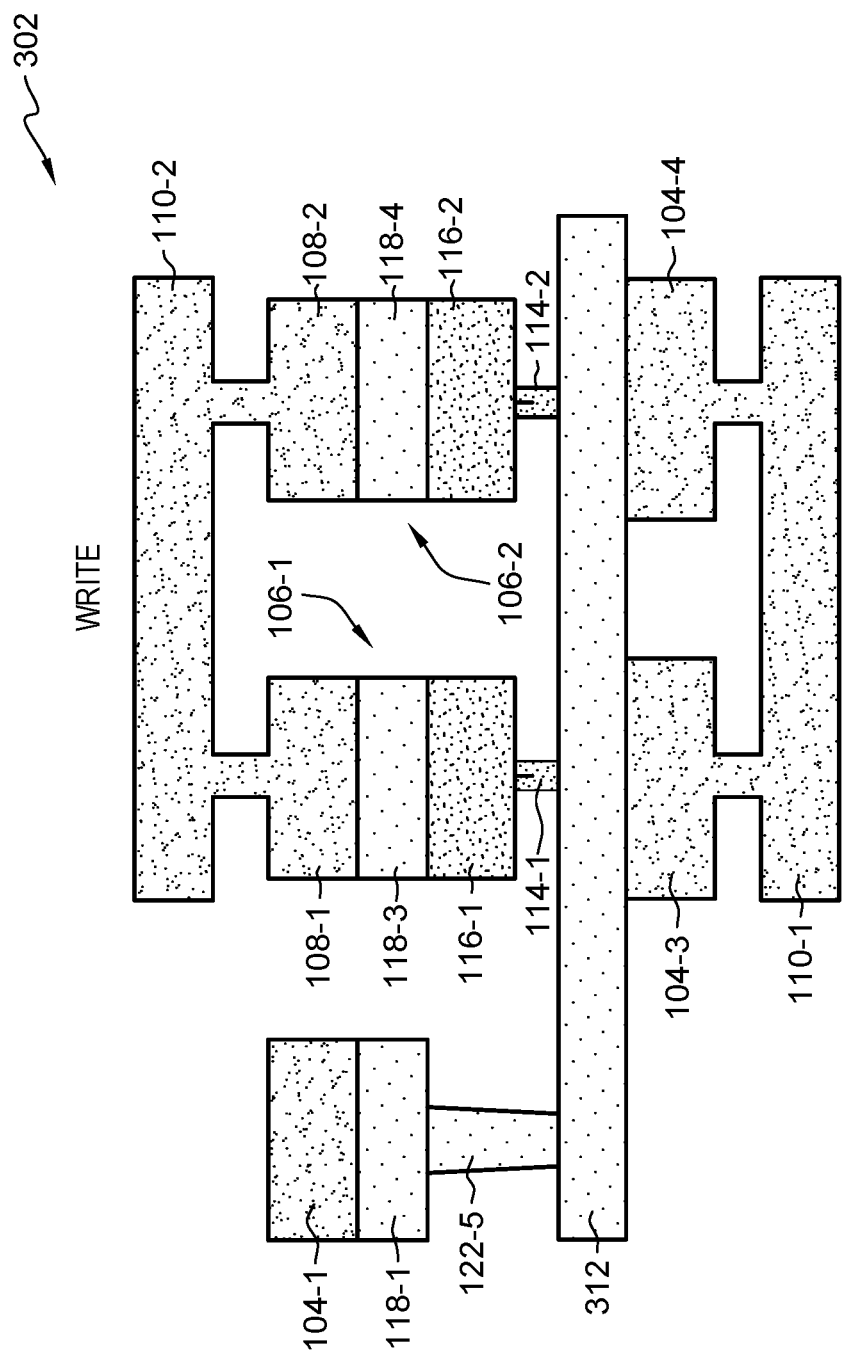
FIGS. 5A-5D are a series of cross-section views of a "not" (NOT) LGMD including PCM material, in accordance with an embodiment of the present disclosure.

The consequences of the difference between LGMD 302 and LGMDs 102 and 202 are demonstrated in FIGS. 5A-5D. FIG. 5A shows LGMD 202 in a state wherein PCM materials 116 are both crystalline (a.k.a., set), so the electrical resistances across PCM cells 106 are low. This can be the initial state of LGMD 202, or it can be the result of a setting current pulse having been applied to both PCM materials 116, for example, after a logic gate result is no longer needed, to prepare LGMD 202 for a new operation. Subsequently, this state can be maintained given a "false" (a.k.a., 0) input at input 104-1 such that zero current was applied to reset PCM materials 116.

Figure 5B:
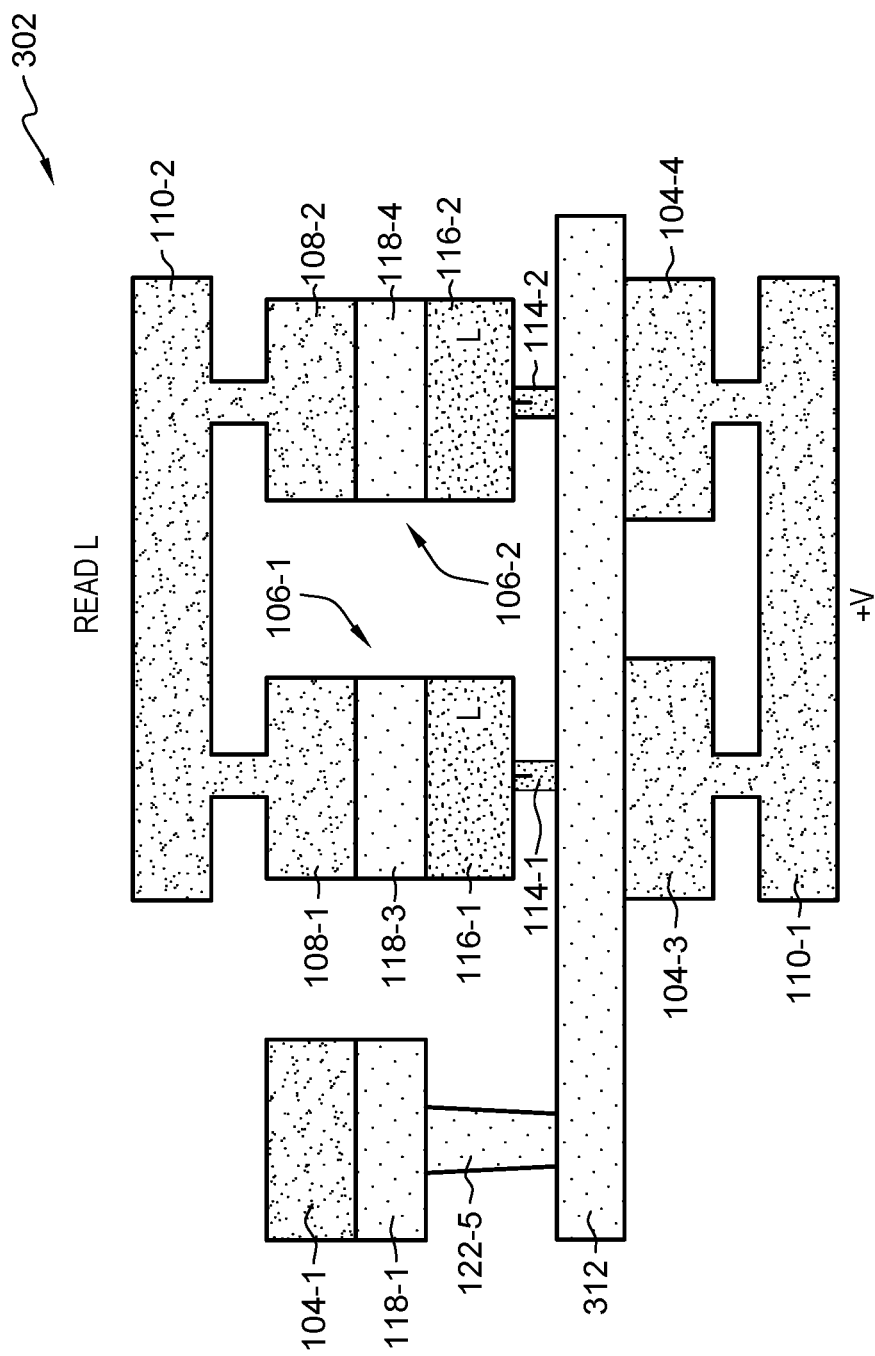

FIG. 5B shows LGMD 202 being read, wherein the voltage drop from bridge 110-1 to bridge 110-2 is measured. The result of the reading is that there is a high voltage output (a.k.a., a low voltage drop) through LGMD 202 due to its low resistance. Thereby, a "true" (a.k.a., 1) result is returned.

Figure 5C:
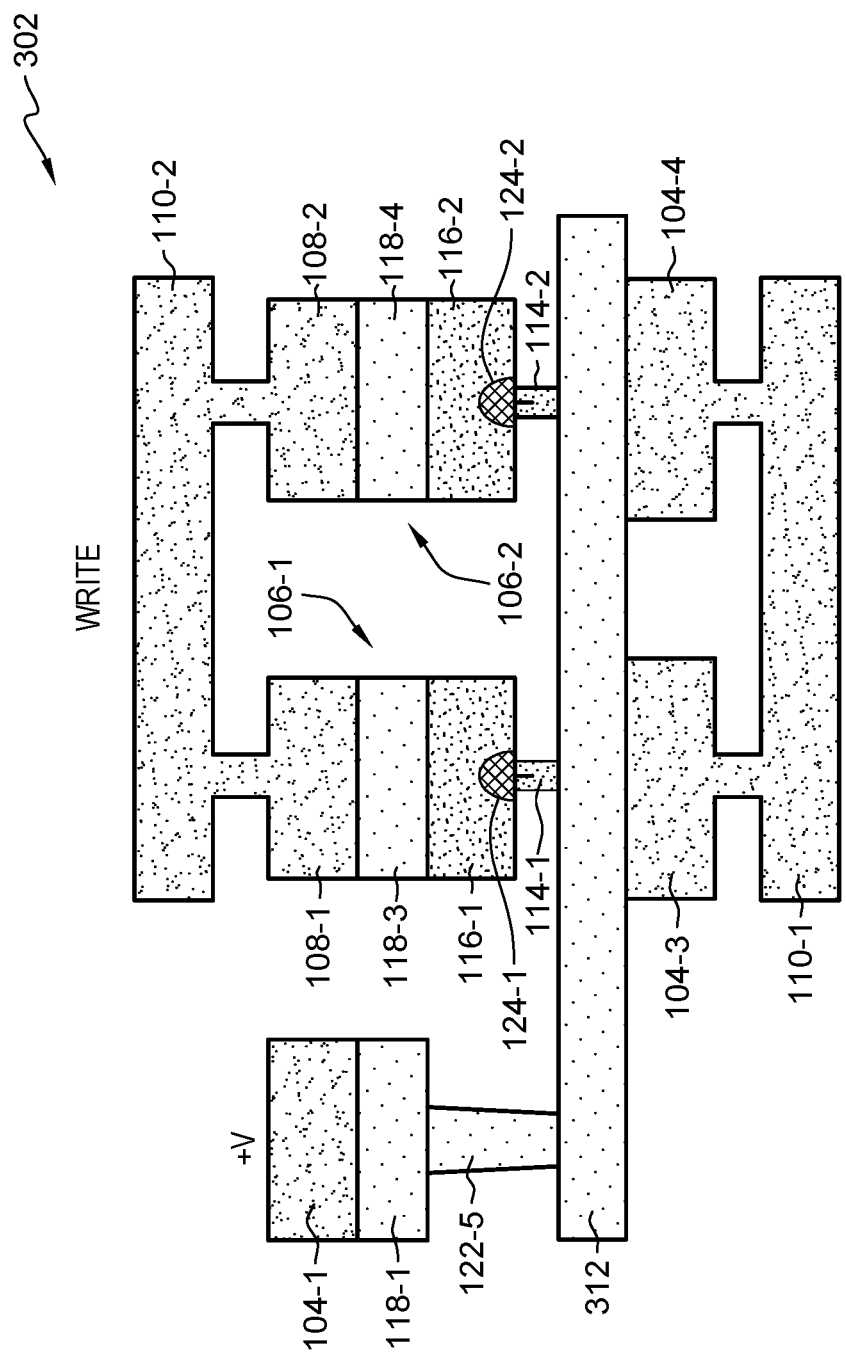

FIG. 5C shows LGMD 202 in a state wherein PCM materials 116 both include amorphous zones 124, respectively. So, the electrical resistance across both PCM cells 106 is high. This can be the result of a "true" input at input 104-1 because bottom electrode 218 connects input 104-1 to both PCM cells 106. Therefore, a resetting current pulse from input 104-1 is able to reset both PCM materials 116.

Figure 5D:
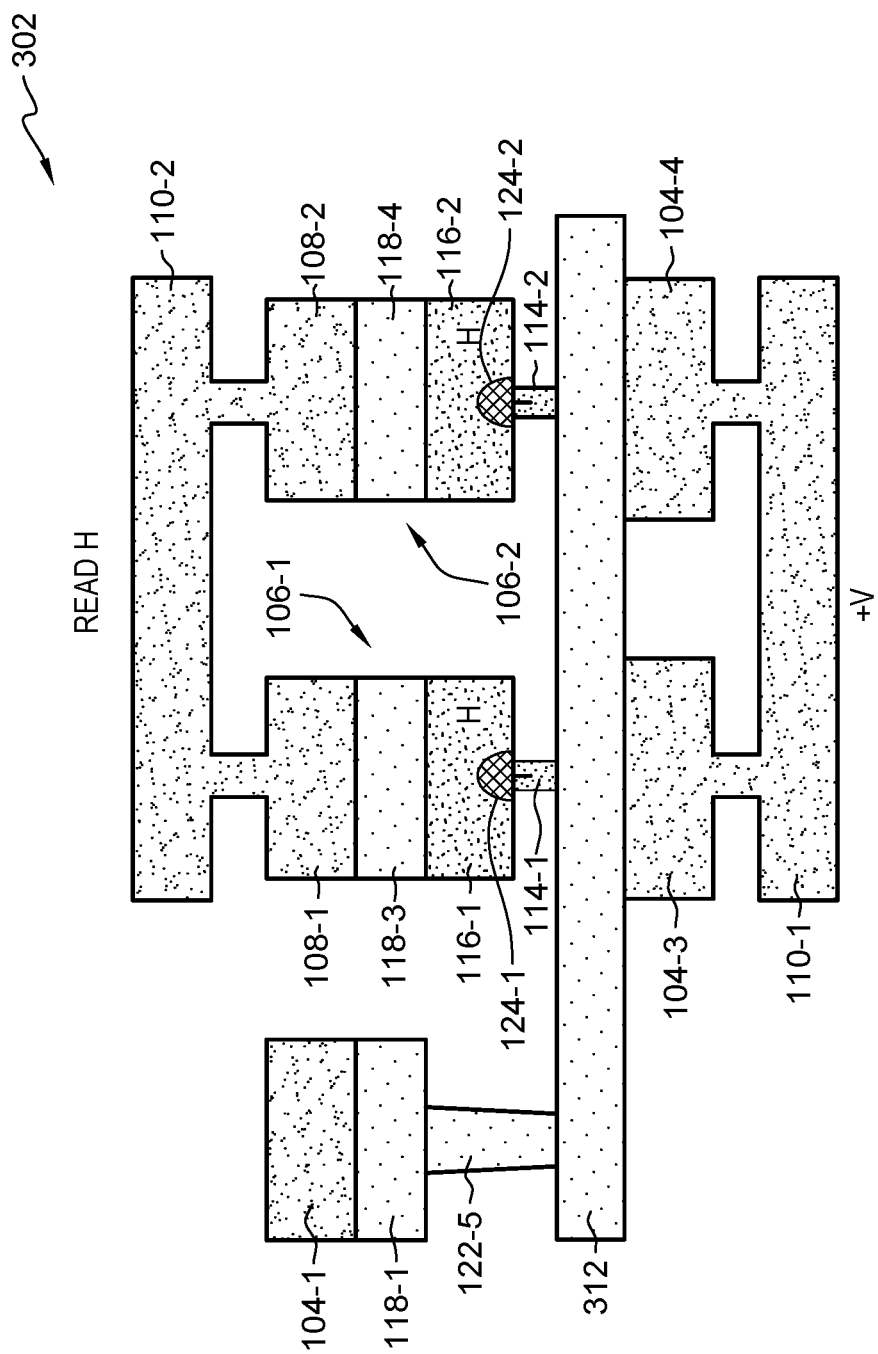

FIG. 5D shows LGMD 202 being read, wherein the voltage drop from bridge 110-1 to bridge 110-2 is measured. The result of the reading is that there is a low voltage output through LGMD 202 due to both pathways through PCM cells 106 having high resistance. Thereby, a "false" result is returned.

Thereby, LGMD 302 presents the characteristic responses of a NOT gate:
(FIGS. 5A and 5B) Input: 0; Output:1
(FIGS. 5C and 5D) Input: 1; Output:0

Therefore, LGMD 302 can function as a logic gate during the writing stage using input 104-1. After that stage has been completed, the result of the NOT logic operation can be stored in LGMD 302 without needing electrical power. Then, the result can be retrieved by reading LGMD 302 using inputs 104-3 and 104-4 (e.g., via bridge 110-1). Furthermore, having two parallel PCM cells 106 provides redundancy in LGMD 302. However, in some embodiments, PCM cell 106-2 can be absent (along with its corresponding connection features), and such an LGMD 302 would still be able to function as a NOT logic gate memory device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device comprising:
   a first phase change memory (PCM) cell comprising:
   a first electrical input; and
   a first phase change material;
   a second PCM cell comprising:
   a second electrical input that is independent from the first electrical input;
   a second phase change material;
   a first bridge that is electrically connected to the first PCM cell and the second PCM cell on a top side of the first PCM cell and on a top side of the second PCM cell; and
   a second bridge that is electrically connected to the first PCM cell and the second PCM cell on a bottom side of the first PCM cell and on a bottom side of the second PCM cell.

2. The memory device of claim 1, further comprising:
   a third electrical input electrically connected to a first bottom electrode; and
   a fourth electrical input electrically connected to a second bottom electrode;
   wherein the first electrical input and the second electrical input are configured to provide a writing electrical current to the first phase change material and the second phase change material, respectively; and wherein the third electrical input and the fourth electrical input are configured to provide a reading electrical current to the first phase change material and the second phase change material, respectively.

3. The memory device of claim 2, wherein the first bottom electrode is not electrically connected to the second bottom electrode such that the memory device has a NAND configuration.

4. The memory device of claim 2, wherein the first bottom electrode is electrically connected to the second bottom electrode such that the memory device has a NOR configuration.

5. The memory device of claim 2, wherein:
the third electrical input is independent of the first electrical input;
the fourth electrical input is independent of the second electrical input; and
the second bridge is electrically connected to the third electrical input and the fourth electrical input.

6. The memory device of claim 1, further comprising:
a third electrical input electrically connected to the first bottom electrode;
wherein the first electrical input and the second electrical input are configured to provide a reading electrical current to the first phase change material and the second phase change material, respectively;
wherein the third electrical input is configured to provide a writing electrical current to the first phase change material and the second phase change material; and
wherein the first bottom electrode is electrically connected to the second bottom electrode such that the memory device has a NOT configuration.

7. The memory device of claim 1, wherein the first phase change material is selected from the group consisting of: germanium-antimony-tellurium (GST), gallium-antimony-tellurium (GaST), and silver-iridium-antimony-telluride (AIST).

8. The memory device of claim 1, wherein:
the first PCM cell further comprises:
a first bottom electrode electrically connected to the first electrical input;
a first heater electrically connected to the first bottom electrode;
a first top electrode electrically connected to the first phase change material; and
a first electrical output electrically connected to the first top electrode;
the second PCM cell further comprises:
a second bottom electrode electrically connected to the second electrical input;
a second heater electrically connected to the second bottom electrode;
a second top electrode electrically connected to the second phase change material; and
a second electrical output electrically connected to the second top electrode;
the first phase change material is electrically connected to the first heater;
the second phase change material is electrically connected to the second heater; and
the first bridge that is electrically connected to the first electrical output and the second electrical output.

9. A memory device for an integrated circuit comprising:
a first phase change memory (PCM) cell that includes a first electrical output;
a second PCM cell that includes a second electrical output;
a first electrical input that is electrically connected to the first PCM cell;
a second electrical input that is electrically connected to the second PCM cell, wherein the second electrical input is independent from the first electrical input;
a first bridge that is electrically connected to the first electrical output and the second electrical output; and
a second bridge that is electrically connected to an input side of the first PCM cell and to an input side of the second PCM cell.

10. The memory device of claim 9, further comprising:
a third electrical input electrically connected to the first PCM cell; and
a fourth electrical input electrically connected to the second PCM cell;
wherein the first electrical input and the second electrical input are configured to provide a writing electrical current to the first PCM cell and the second PCM cell, respectively; and
wherein the third electrical input and the fourth electrical input are configured to provide a reading electrical current to the first PCM cell and the second PCM cell, respectively.

11. The memory device of claim 10, wherein:
the integrated circuit comprises a plurality of layers; and
first electrical input and the third electrical input are positioned in different layers of the plurality of layers.

12. The memory device of claim 11, wherein the second electrical input and the fourth electrical input are positioned in different layers of the plurality of layers, and the third electrical input and the fourth electrical input are on the same layer of the plurality of layers.

13. The memory device of claim 10, wherein:
the first electrical input is not electrically connected to the second PCM cell; and
the second electrical input is not electrically connected to the first PCM cell, such that the memory device has a NAND configuration.

14. The memory device of claim 10, wherein
the first electrical input is electrically connected to the second PCM cell; and
the second electrical input is also electrically connected to the first PCM cell, such that the memory device has a NOR configuration.

15. The memory device of claim 9, wherein the first PCM cell comprises:
a first electrode;
a heater adjacent to the first electrode;
a phase change material adjacent to the heater; and
a second electrode adjacent to the phase change material.

16. The memory device of claim 9, wherein:
the integrated circuit comprises a plurality of layers; and
the first bridge is positioned in a different layer from the first electrical output and the second electrical output.

17. A method of using a memory device that comprises a first phase change memory (PCM) cell with a first input and a first PCM material, a second PCM cell with a second input that is independent from the first input and a second PCM material, and a bridge electrically connecting a first output of the first PCM cell and a second output of the second PCM cell, the method comprising:
passing a first electrical current pulse from the first input into the first PCM material to create a first amorphous zone in the first PCM cell;
measuring a voltage drop across the first PCM cell and the second PCM cell using a third input electrically connected to the first PCM cell and a second input electrically connected to the second PCM cell; and determining whether the memory device is storing a true or false result based on the voltage drop.

18. The method of claim 17, wherein passing the first electrical current pulse from the first input creates a second amorphous zone in the second PCM cell.

19. The method of claim 17, further comprising:

passing a second electrical current pulse from the first input into the first PCM material to set the first PCM material in the first amorphous zone in the first PCM cell.

20. The method of claim 17, further comprising:

passing a third electrical current pulse from the first input into the first PCM material to create a third amorphous zone in the first PCM cell;

passing a fourth electrical current pulse from the second input into the first PCM material to create a fourth amorphous zone in the second PCM cell;

measuring a voltage drop across the first PCM cell and the second PCM cell; and determining that the memory device is storing a false value based on the voltage drop being high.

* * * * *